United States Patent
Orihara et al.

(10) Patent No.: US 10,001,699 B2
(45) Date of Patent: Jun. 19, 2018

(54) MASK BLANK SUBSTRATE, SUBSTRATE WITH MULTILAYER REFLECTION FILM, TRANSMISSIVE MASK BLANK, REFLECTIVE MASK, AND SEMICONDUCTOR DEVICE FABRICATION METHOD

(71) Applicant: HOYA CORPORATION, Shinjuku-ku, Tokyo (JP)

(72) Inventors: Toshihiko Orihara, Shinjuku-ku (JP); Kazuhiro Hamamoto, Shinjuku-ku (JP); Hirofumi Kozakai, Shinjuku-ku (JP); Youichi Usui, Shinjuku-ku (JP); Tsutomu Shoki, Shinjuku-ku (JP); Junichi Horikawa, Shinjuku-ku (JP)

(73) Assignee: HOYA CORPORATION, Shinjuku-ku, Tokyo (JP)

(*) Notice: Subject to any disclaimer, the term of this patent is extended or adjusted under 35 U.S.C. 154(b) by 86 days.

(21) Appl. No.: 15/275,719

(22) Filed: Sep. 26, 2016

(65) Prior Publication Data

US 2017/0010527 A1    Jan. 12, 2017

Related U.S. Application Data

(63) Continuation of application No. 14/348,413, filed as application No. PCT/JP2013/059199 on Mar. 28, 2013, now Pat. No. 9,494,851.

(30) Foreign Application Priority Data

Mar. 28, 2012   (JP) .................................. 2012-074626

(51) Int. Cl.
G03F 1/22   (2012.01)
C03C 3/06   (2006.01)
(Continued)

(52) U.S. Cl.
CPC ................ *G03F 1/48* (2013.01); *B82Y 10/00* (2013.01); *B82Y 40/00* (2013.01); *C03C 3/06* (2013.01);
(Continued)

(58) Field of Classification Search
None
See application file for complete search history.

(56) References Cited

U.S. PATENT DOCUMENTS 7,220,690 B2   5/2007   Mitra et al.
7,923,178 B2   4/2011   Ito et al.
(Continued)

FOREIGN PATENT DOCUMENTS

JP   2005-231994 A   9/2005
JP   2006-035413 A   2/2006
(Continued)

OTHER PUBLICATIONS

Communication dated Jan. 27, 2017, from the Japanese Patent Office in counterpart application No. 2015-202956.
Tezuka et al., "Sensitivity-Limiting Factors of at-Wavelength Extreme Ultraviolet Lithography Mask Blank Inspection," Japanese Journal of Applied Physics; vol. 45, No. 6B (2006) pp. 5359-5372.

*Primary Examiner* — Stephen Rosasco
(74) *Attorney, Agent, or Firm* — Sughrue Mion, PLLC

(57) ABSTRACT

Disclosed is a mask blank substrate for use in lithography, wherein the main surface on which the transfer pattern of the substrate is formed has a root mean square roughness (Rms) of not more than 0.15 nm obtained by measuring an area of 1 μm×1 μm with an atomic force microscope, and has a power spectrum density of not more than 10 $nm^4$ at a spatial frequency of not less than 1 $\mu m^{-1}$.

14 Claims, 6 Drawing Sheets

(51) Int. Cl.
*G03F 1/48* (2012.01)
*G02B 5/08* (2006.01)
*B82Y 10/00* (2011.01)
*B82Y 40/00* (2011.01)
*G03F 7/20* (2006.01)
*C03C 17/34* (2006.01)
*C03C 17/36* (2006.01)
*C03C 23/00* (2006.01)
*G03F 7/16* (2006.01)
*H01L 21/308* (2006.01)

(52) U.S. Cl.
CPC ...... *C03C 17/3435* (2013.01); *C03C 17/3626* (2013.01); *C03C 17/3636* (2013.01); *C03C 17/3639* (2013.01); *C03C 17/3649* (2013.01); *C03C 17/3665* (2013.01); *C03C 23/0075* (2013.01); *G02B 5/08* (2013.01); *G02B 5/0816* (2013.01); *G02B 5/0891* (2013.01); *G03F 1/22* (2013.01); *G03F 7/16* (2013.01); *G03F 7/2002* (2013.01); *G03F 7/2004* (2013.01); *G03F 7/70733* (2013.01); *H01L 21/3081* (2013.01); *H01L 21/3085* (2013.01); *C03C 2201/42* (2013.01); *C03C 2218/33* (2013.01)

(56) References Cited

U.S. PATENT DOCUMENTS

| | | | |
|---|---|---|---|
| 7,998,645 | B2 | 8/2011 | Otsuka et al. |
| 8,029,950 | B2 | 10/2011 | Hayashi et al. |
| 2005/0197242 | A1 | 9/2005 | Mitra et al. |
| 2008/0132150 | A1 | 6/2008 | Arserio et al. |
| 2008/0311487 | A1 | 12/2008 | Ito et al. |
| 2010/0028787 | A1 | 2/2010 | Koike |
| 2010/0304283 | A1 | 12/2010 | Hayashi et al. |
| 2011/0281069 | A1 | 11/2011 | Otsuka et al. |
| 2013/0105331 | A1 | 5/2013 | Zhan et al. |

FOREIGN PATENT DOCUMENTS

| | | |
|---|---|---|
| JP | 2006-278515 A | 10/2006 |
| JP | 2007-213020 A | 8/2007 |
| JP | 2007-273652 A | 10/2007 |
| JP | 2008-094649 A | 4/2008 |
| JP | 2008-156215 A | 7/2008 |
| JP | 2008-201665 A | 9/2008 |
| JP | 2008-268980 A | 11/2008 |
| JP | 2009-510711 A | 3/2009 |
| JP | 2009-297814 A | 12/2009 |
| JP | 2012-052870 A | 3/2012 |
| WO | 2009/116348 A1 | 9/2009 |
| WO | 2012/003780 A1 | 1/2012 |

(a)

(b)

MASK BLANK SUBSTRATE, SUBSTRATE WITH MULTILAYER REFLECTION FILM, TRANSMISSIVE MASK BLANK, REFLECTIVE MASK, AND SEMICONDUCTOR DEVICE FABRICATION METHOD

CROSS REFERENCE TO RELATED APPLICATIONS

This is a Continuation of application Ser. No. 14/348,413, filed Mar. 28, 2014, claiming priority based on International Application No. PCT/JP2013/059199 filed Mar. 28, 2013, claiming priority based on Japanese Patent Application No. 2012-074626 filed Mar. 28, 2012, the contents of all of which are incorporated herein by reference in their entirety.

TECHNICAL FIELD

The present invention relates to a mask blank substrate, a substrate with a multilayer reflective film, a transmissive mask blank, a reflective mask blank, a transmissive mask, a reflective mask, and a method of manufacturing a semiconductor device, which ensure suppression of false defects (pseudo defects, nuisance defects) originating from the surface roughness of a substrate and a film in defect inspection using a defect inspection apparatus of a high sensitivity, and facilitate the detection of critical defects such as foreign matters and scratches.

BACKGROUND ART

Generally, in the process of manufacturing a semiconductor device, fine patterns are formed using photolithography. A number of transfer masks called photomasks are normally used in forming the fine patterns. This transfer mask is generally a fine pattern formed by a metal thin film or the like and provided on a transparent glass substrate, and photolithography is also used in the fabrication of the transfer mask.

A mask blank having a thin film (e.g., a light shielding film (an opaque film)) for forming a transfer pattern (a mask pattern) on a transparent substrate such as a glass substrate is used in fabricating the transfer mask by photolithography. The fabrication of the transfer mask using the mask blank involves a drawing process of drawing a desired pattern on a resist film formed on the mask blank, a developing process of developing the resist film after drawing to form a desired resist pattern, an etching process of etching the thin film as a mask, and a process of stripping and removing the remaining resist pattern with the resist pattern used as a mask. In the developing process, after the desired pattern is drawn on the resist film formed on the mask blank, a developer is supplied to the resist film to dissolve a portion of the resist film which is soluble in the developer, thereby forming the resist pattern. In the etching step, with the resist pattern used as a mask, an exposed portion of the thin film where the resist pattern is not formed is removed by wet etching or dry etching, thereby forming a desired mask pattern on the transparent substrate. The transfer mask is finished in this way.

A phase shift mask, as well as a binary mask having a light shielding pattern of a chromium-based material on a conventional transparent substrate, is known as the types of a transfer mask. The phase shift mask is configured to have a phase shift film on a transparent substrate. The phase shift film has a predetermined phase difference, and is made of, for example, a material containing molybdenum silicide compound. Further, a binary mask using a material containing a silicide compound of a metal such as molybdenum for a light shielding film is being used. These binary mask and phase shift mask are generally called a transmissive mask herein, and a binary mask blank and a phase shift mask blank, which are used as a master for a transfer mask, are generally called a transmissive mask blank herein.

In recent years, higher integration of semiconductor devices in the semiconductor industry requires fine patterns beyond the transfer limit of the conventional photolithography using ultraviolet light. To enable formation of such fine patterns, EUV lithography which is an exposure technique using extreme ultraviolet (hereafter referred to as "EUV") is promising. EUV light refers to light in the waveband of the soft X-ray region or the vacuum ultraviolet region, specifically, light with a wavelength of about 0.2 to 100 nm. A reflective mask has been proposed as a transfer mask for use in the EUV lithography. Such a reflective mask has a multilayer reflective film formed on a substrate to reflect exposure light, and an absorber film patterned on the multilayer reflective film to absorb exposure light.

The reflective mask is fabricated by forming an absorber film pattern using photolithography from the reflective mask blank including a substrate, a multilayer reflective film formed on the substrate, and an absorber film formed on the multilayer reflective film.

As described above, as a demand for miniaturization in the lithography process increases, problems in the lithography process are becoming prominent. One of the problems concerns defect information on a mask blank substrate and a substrate with a multilayer reflective film, which are used in the lithography process.

The mask blank substrate is demanded to have a higher flatness from the viewpoints of an improvement on the defect quality needed with the recent miniaturization of patterns and the optical characteristics needed for transfer masks. The conventional surface processing methods for mask blank substrates are described in, for example, Patent Literatures 1 to 3.

Patent Literature 1 describes a glass-substrate polishing method of polishing the surface of a glass substrate essentially comprising $SiO_2$ by using a polishing slurry containing colloidal silica with an average primary particle size of 50 nm or less, acid, and water, and adjusted to have a pH of 0.5 to 4, in such a way that the surface roughness, Rms, as measured with an atomic force microscope becomes not more than 0.15 nm.

Patent Literature 2 describes a polishing agent for the synthetic quartz glass substrate, which contains a suppressive colloidal solution and an acidic amino acid to suppress the formation of defects to be detected by a high-sensitivity defect inspection apparatus on the surface of a synthetic quartz glass substrate.

Patent Literature 3 describes a method of controlling the flatness of a quartz glass substrate by placing the quartz glass substrate in a hydrogen radical etching apparatus, and causing hydrogen radicals to act with the quartz glass substrate, so that the flatness can be controlled in the sub-nanometer order.

The substrate with a multilayer reflective film is also demanded to have a higher flatness from the viewpoints of an improvement on the defect quality needed with the recent miniaturization of patterns and the optical characteristics needed for transfer masks. The multilayer reflective film is formed by alternately laminating a high refractive index layer and a low refractive index layer on the surface of the mask blank substrate. Those layers are generally formed by sputtering using sputtering targets made of materials for forming the layers.

As a method of sputtering, ion beam sputtering is preferably carried out, it is because it does not need produce a plasma through discharge, making it difficult to mix an impurity in the multilayer reflective film, and has an independent ion source so that the conditions are set relatively easily. In view of the smoothness and surface uniformity of each layer to be formed, sputter particles are reached the main surface of the mask blank substrate at a large angle to the normal line of the main surface of the mask blank substrate (line perpendicular to the main surface), i.e., at an angle oblique to or nearly parallel to the main surface of the substrate to deposit a high refractive index layer and a low refractive index layer.

As a technique of manufacturing a substrate with a multilayer reflective film with this way, Patent Literature 4 describes that at the time of deposing a multilayer reflective film for a reflective mask blank for EUV lithography on a substrate, ion beam sputtering is carried out by keeping the absolute value of an angle α defined by the normal line of the substrate and the sputtered particles incident to the substrate at $35° \leq \alpha \leq 80°$ while rotating the substrate about the central axis of the substrate.

Patent Literature 1: JP-A-2006-35413
Patent Literature 2: JP-A-2009-297814
Patent Literature 3: JP-A-2008-94649
Patent Literature 4: Unexamined Japanese Patent Application Publication (Published Japanese Translation of PCT Application) JP-A-2009-510711

With the rapid miniaturization of patterns in lithography using an ArF excimer laser or EUV (Extreme Ultra-Violet), the defect sizes of transmissive masks (also called optical masks), such as a binary mask and a phase shift mask, and an EUV mask that is a reflective mask, are also becoming smaller. To find such fine defects, the wavelength of the inspection light source used in defect inspection is approaching the light source wavelength of the exposure light.

For example, as a defect inspection apparatus for an optical mask, a mask blank, which is a master thereof, and a substrate, high-sensitivity defect inspection apparatuses with an inspection light source wavelength of 193 nm are becoming popular. As an EUV mask, an EUV mask blank, which is a master of an EUV mask, and a substrate, high-sensitivity defect inspection apparatuses with inspection light source wavelengths of 266 nm (for example, the mask substrate/blank defect inspection apparatus "MAGICS M7360" for EUV exposure of Lasertec Corp.), of 193 nm (EUV mask/blank defect inspection apparatus "Teron 600 series" of KLA-Tencor Corp.), and of 13.5 nm are becoming popular.

The main surface of a substrate used for the conventional transfer mask is managed by surface roughness represented by Rms (root mean square roughness) and Rmax (maximum height) in the fabrication process. Because the detection sensitivity of the high-sensitivity defect inspection apparatus described above is high, however, many false defects are detected in defect inspection of the main surface of the substrate even when the smoothness in compliance with Rms and Rmax becomes higher from the viewpoint of the improvement on the defect quality, raising a problem such that the defect inspection cannot be performed to the end.

Further, an attempt is made to deposit the multilayer reflective film of the substrate with a multilayer reflective film used in the conventional transfer mask by, for example, the method described in "Background Art" to reduce recess defects present on the substrate. Even if defects originating from the recess defects on the substrate can be reduced, defect inspection on the multilayer reflective film raises a problem such that many defects are detected (the number of defects detected=critical defects+false defects) because the detection sensitivity of the high-sensitivity defect inspection apparatus described above is high.

The false defect mentioned herein refers to a tolerable irregularity on the substrate surface or the multilayer reflective film, which does not affect pattern transfer, and which is erroneously determined as a defect in inspection with a high-sensitivity defect inspection apparatus. When a lot of such false defects are detected in defect inspection, critical defects that affect pattern transfer may be buried in many false defects, so that the critical defects cannot be discovered. For example, a defect inspection apparatus having an inspection light source wavelength of 266 nm, 193 nm or 13.5 nm, which is currently becoming popular, cannot inspect the presence or absence of critical defects for a substrate or a substrate with a multilayer reflective film having a size of, for example, 132 mm×132 mm, because the number of detected defects exceeds 100,000. Overlooking critical defects in defect inspection would cause failures in the later mass production process of semiconductor devices, leading to wasteful labor and economical loss.

DISCLOSURE OF THE INVENTION

The present invention has been made in consideration of the aforementioned problems, and it is an object of the invention to provide a mask blank substrate, a substrate with a multilayer reflective film, a transmissive mask blank, a reflective mask blank, a transmissive mask, a reflective mask, and a method of manufacturing a semiconductor device, which ensure suppression of false defects originating from the surface roughness of a substrate and a film in defect inspection using a defect inspection apparatus of a high sensitivity, and facilitate the detection of critical defects such as foreign matters and scratches.

Further, it is another object of the invention to provide a substrate with a multilayer reflective film, which has fewer defects including false defects to be detected even by a high-sensitivity defect inspection apparatus using lights with various wavelengths, achieves smoothness required particularly for a substrate with a multilayer reflective film, and, at the same time, permits critical defects to be reliably detected because of fewer detected defects including false defects, a method of manufacturing the substrate with a multilayer reflective film, a reflective mask blank obtained by using the substrate, a method of manufacturing the reflective mask blank, a reflective mask and a method of manufacturing the same, and a method of manufacturing a semiconductor device.

The present inventors have made intensive studies to solve the above problems, and have discovered that the roughness of the component of a predetermined spatial frequency (or spatial wavelength) affects the inspection light source wavelength of a high-sensitivity defect inspection apparatus. Accordingly, the spatial frequency of that roughness component among the roughness (unevenness) components on the main surface of a substrate or a film (for example, multilayer reflective film) which is erroneously determined as a false defect is specified, and the amplitude intensity at this spatial frequency is managed to enable suppression of detection of false defects and make critical defects noticeable in defect inspection.

In addition, while some attempts have been made to reduce the surface roughness of a multilayer reflective film of a substrate with a multilayer reflective film from the viewpoints of the reflectance characteristics of the multilayer reflective film, the relation of the surface roughness with detection of false defects by a high-sensitivity defect inspection apparatus, has not been known.

To achieve the objects, a mask blank substrate for use in lithography according to an exemplary embodiment of the invention is configured so that the main surface on which the transfer pattern of the substrate is formed has a root mean square roughness (Rms) of not more than 0.15 nm obtained by measuring an area of 1 μm×1 μm with an atomic force microscope, and has a power spectrum density of not more than 10 nm$^4$ at a spatial frequency of not less than 1 μm$^{-1}$.

To achieve the objects, a substrate with a multilayer reflective film according to an exemplary embodiment of the invention is configured to comprise a multilayer reflective film having a high refractive index layer and a low refractive index layer alternately laminated on the surface of the aforementioned mask blank substrate of the invention.

To achieve the objects, a substrate with a multilayer reflective film according to an exemplary embodiment of the invention is configured to comprise a multilayer reflective film having a high refractive index layer and a low refractive index layer alternately laminated on a main surface of a mask blank substrate for use in lithography, wherein a surface of the multilayer-reflective-film formed substrate has a root mean square roughness (Rms) of not more than 0.15 nm, obtained by measuring an area of 1 μm×1 μm with an atomic force microscope, and has a power spectrum density of not more than 20 nm$^4$ at a spatial frequency of not less than 1 μm$^{-1}$.

To achieve the objects, a transmissive mask blank according to an exemplary embodiment of the invention is configured to comprise a light shielding function film to be a transfer pattern on the main surface of the aforementioned mask blank substrate of the invention.

To achieve the objects, a reflective mask blank according to an exemplary embodiment of the invention is configured to comprise an absorber film to be a transfer pattern on the multilayer reflective film or the protective film of the aforementioned substrate with a multilayer reflective film of the invention.

To achieve the objects, a transmissive mask according to an exemplary embodiment of the invention is configured to comprise a light shielding function film pattern provided on the main surface by patterning the light shielding function film of the aforementioned transmissive mask blank of the invention.

To achieve the objects, a reflective mask according to an exemplary embodiment of the invention is configured to comprise an absorber pattern provided on the multilayer reflective film by patterning the absorber film of the aforementioned reflective mask blank of the invention.

To achieve the objects, a method of manufacturing a semiconductor device according to an exemplary embodiment of the invention is configured to comprise a step of forming a transfer pattern on a transferred substrate using the aforementioned transmissive mask of the invention by performing a lithography process using an exposure device.

To achieve the objects, a method of manufacturing a semiconductor device according to an exemplary embodiment of the invention is configured to comprise a step of forming a transfer pattern on a transferred substrate using the aforementioned reflective mask of the invention by performing a lithography process using an exposure device.

DETAILED DESCRIPTION OF THE INVENTION

General Description

Figure 1:
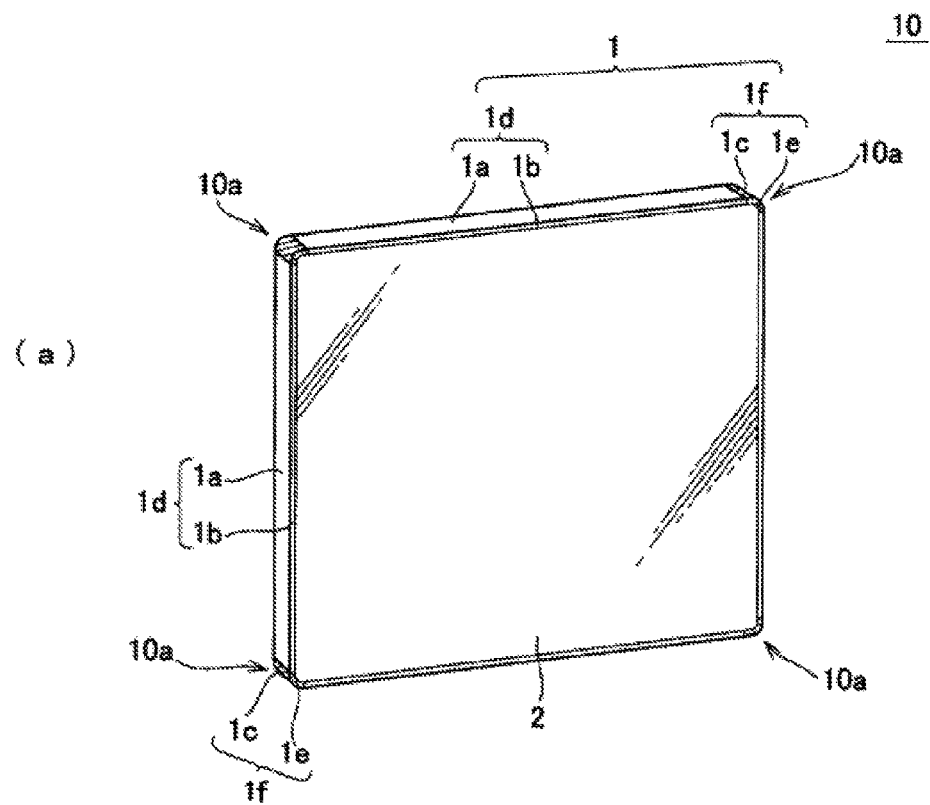
FIG. 1(a) is a perspective view illustrating a mask blank substrate 10 according to an exemplary embodiment of the present invention.
FIG. 1(b) is a schematic cross-sectional view illustrating the mask blank substrate 10 of the present embodiment.
Figure 1:
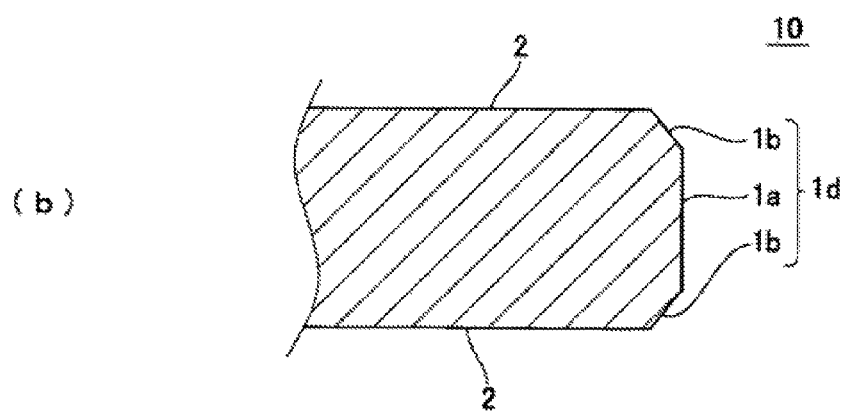

To achieve the above-described objects, the present invention has the following configurations.

(First Configuration)

A first configuration of the present invention is a mask blank substrate for use in lithography, wherein the main surface on which the transfer pattern of the substrate is formed has a root mean square roughness (Rms) of not more than 0.15 nm obtained by measuring an area of 1 μm×1 μm with an atomic force microscope, and has a power spectrum density of not more than 10 nm$^4$ at a spatial frequency of not less than 1 μm$^{-1}$.

According to the first configuration, the main surface of the mask blank substrate is configured in such a way that the power spectrum density, which is the amplitude intensity of all roughness components detectable in an area of 1 μm×1 μm, at a spatial frequency of not less than 1 μm$^{-1}$, is set to not more than 10 nm$^4$, making it possible to suppress detection of false defects in the defect inspection using a high-sensitivity defect inspection apparatus, thereby making the critical defects more noticeable.

(Second Configuration)

A second configuration of the invention is a mask blank substrate according to the first configuration, wherein the main surface has a power spectrum density of not more than 10 nm$^4$, obtained by measuring an area of 1 μm×1 μm with an atomic force microscope, at a spatial frequency of not less than 1 μm$^{-1}$ and not more than 10 μm$^{-1}$.

According to the second configuration, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, thereby making the critical defects more noticeable.

(Third Configuration)

A third configuration of the invention is a mask blank substrate according to the second configuration, wherein the main surface has a power spectrum density of not less than 1 nm$^4$ and not more than 10 nm$^4$, obtained by measuring an area of 1 μm×1 μm with an atomic force microscope, at a spatial frequency of not less than 1 μm$^{-1}$ and not more than 10 μm$^{-1}$.

According to the third configuration, reducing the power spectrum density to 1 nm$^4$ makes it possible to sufficiently suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, thereby making the critical defects more noticeable. Therefore, it is not necessary to form the main surface in an extremely smooth and highly precise surface state, so that the load of the process of manufacturing the mask blank substrate can be decreased.

(Fourth Configuration)

A fourth configuration of the invention is a mask blank substrate according to any one of the first to third configurations, wherein the main surface is subjected to a surface treatment with catalyst-referred etching.

According to the fourth configuration, because the main surface is selectively subjected to a surface treatment from convex portions contacting the surface of the catalyst which is a reference surface by catalyst-referred etching, irregularities (surface roughness) forming the main surface become highly aligned surface states while being kept very smooth, and become such surface states that the ratio of concave portions is greater than the ratio of convex portions with respect to the reference surface. When a plurality of thin films are laminated on the main surface, the size of defects on the main surface tend to become smaller, which is preferable from the viewpoint of the defect quality. Particularly, the effect is demonstrated when a multilayer reflective film to be described later is formed on the main surface. Further, execution of a surface treatment to the main surface by catalyst-referred etching as mentioned above makes it possible to relatively easily form the surface with the surface roughness and the power spectrum density as defined in the first to third configurations.

(Fifth Configuration)

A fifth configuration of the invention is a mask blank substrate according to any one of the first to fourth configurations, wherein the mask blank substrate is used in EUV lithography.

According to the fifth configuration, the substrate is a mask blank substrate for use in EUV lithography, whereby the surface state of the multilayer reflective film formed on the main surface becomes very smooth, so that the reflectance characteristics to EUV light become better.

(Sixth Configuration)

A sixth configuration of the invention is a mask blank substrate according to the fifth configuration, wherein a thin film of a material comprising a metal, an alloy, or at least one of oxygen, nitrogen and carbon contained in one of the metal and the alloy, is formed on the main surface of a substrate of multi-element glass.

Generally, since a mask blank substrate for use in EUV lithography needs the characteristics of low thermal expansion, so that it is preferred to use a multi-element glass material to be described later. The multi-element glass material has a property such that high smoothness is difficult to obtain compared to synthetic quartz glass. Accordingly, a thin film of a material comprising a metal, an alloy, or at least one of oxygen, nitrogen and carbon contained in one of the metal and the alloy is formed on the main surface of the substrate comprising a multi-element glass material. Substrates having the surface states as defined by the first to fifth configurations are easily obtained by performing a surface treatment to the surface of such a thin film.

(Seventh Configuration)

A seventh configuration of the invention is a substrate with a multilayer reflective film comprising a multilayer reflective film having a high refractive index layer and a low refractive index layer alternately laminated on the surface of the mask blank substrate according to any one of the first to sixth configurations.

According to the seventh configuration, the surface state of the multilayer reflective film formed on the main surface becomes very smooth, so that the reflectance characteristics to EUV light become better. The substrate with a multilayer reflective film can suppress detection of false defects in the defect inspection of the surface of the multilayer reflective film using a high-sensitivity defect inspection apparatus, and further make the critical defects more noticeable. In addition, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, or a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Eighth Configuration)

An eighth configuration of the invention is a substrate with a multilayer reflective film according to the seventh configuration, wherein the substrate with a multilayer reflective film has a protective film on the multilayer reflective film.

According to the eighth configuration, the substrate with a multilayer reflective film has the protective film on the multilayer reflective film to suppress damages to the multilayer reflective film at the time of fabricating a transfer mask (EUV mask), so that the reflectance characteristics to EUV light become better. The substrate with a multilayer reflective film makes it possible to suppress detection of false defects in the defect inspection of the surface of the protective film using a high-sensitivity defect inspection apparatus, and further make the critical defects more noticeable. In addition, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, or a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Ninth Configuration)

A ninth configuration of the invention is a substrate with a multilayer reflective film according to the seventh or eighth configuration, wherein the surface of the multilayer reflective film or the protective film of the substrate with a multilayer reflective film has a power spectrum density of not more than 20 nm$^4$, obtained by measuring an area of 1 μm×1 μm with an atomic force microscope, at a spatial frequency of not less than 1 μm$^{-1}$.

According to the ninth configuration, the surface of the multilayer reflective film or the protective film has a power spectrum density of not more than 20 nm$^4$, obtained by measuring an area of 1 μm×1 μm with an atomic force microscope, at a spatial frequency of not less than 1 μm$^{-1}$, making it possible to suppress detection of false defects in the defect inspection of the surface of the multilayer reflective film using a high-sensitivity defect inspection apparatus, and further make the critical defects more noticeable. In addition, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, or a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Tenth Configuration)

A tenth configuration of the invention is a substrate with a multilayer reflective film according to the ninth configuration, wherein the surface of the multilayer reflective film or the protective film of the substrate with a multilayer reflective film has a power spectrum density of not more than 20 nm$^4$, obtained by measuring an area of 1 μm×1 μm with an atomic force microscope, at a spatial frequency of not less than 1 μm$^{-1}$ and not more than 10 μm$^{-1}$.

According to the tenth configuration, it is possible to significantly suppress detection of false defects in the defect inspection of the substrate with a multilayer reflective film using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, thereby making the critical defects more noticeable.

(Eleventh Configuration)

An eleventh configuration of the invention is a substrate with a multilayer reflective film according to the ninth configuration, wherein the surface of the multilayer reflective film or the protective film of the substrate with a multilayer reflective film has a power spectrum density of not more than 9 nm$^4$, obtained by measuring an area of 1 μm×1 μm with an atomic force microscope, at a spatial frequency of not less than 10 μm$^{-1}$ and not more than 100 μm$^{-1}$.

According to the eleventh configuration, it is possible to significantly suppress detection of false defects in the defect inspection using a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm, thereby making the critical defects more noticeable.

(Twelfth Configuration)

A twelfth configuration of the invention is a substrate with a multilayer reflective film according to any one of the ninth to eleventh configurations, wherein the surface of the multilayer reflective film or the protective film of the substrate with a multilayer reflective film has a root mean square roughness (Rms) of not more than 0.15 nm, obtained by measuring an area of 1 μm×1 μm with an atomic force microscope.

According to the twelfth configuration, it is possible to make the reflectance characteristics needed for the substrate with a multilayer reflective film better in addition to the effect of significantly suppressing detection of false defects in the defect inspection using the high-sensitivity defect inspection apparatuses according to the ninth to eleventh configurations.

(Thirteenth Configuration)

A thirteenth configuration of the invention is a substrate with a multilayer reflective film comprising a multilayer reflective film having a high refractive index layer and a low refractive index layer alternately laminated on a main surface of a mask blank substrate for use in lithography, wherein a surface of the substrate with a multilayer reflective film has a root mean square roughness (Rms) of not more than 0.15 nm, obtained by measuring an area of 1 μm×1 μm with an atomic force microscope, and has a power spectrum density of not more than 20 nm$^4$ at a spatial frequency of not less than 1 μm$^{-1}$.

According to the thirteenth configuration, the surface of the substrate with a multilayer reflective film has the root mean square roughness (Rms) of not more than 0.15 nm, obtained by measuring an area of 1 μm×1 μm with an atomic force microscope, and has the power spectrum density of not more than 20 nm$^4$ at a spatial frequency of not less than 1 μm$^{-1}$, making the reflectance characteristics need for the substrate with a multilayer reflective film better, and making it possible to suppress detection of false defects in defect inspection of the multilayer reflective film using a high-sensitivity defect inspection apparatus, and further make the critical defects more noticeable. In addition, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, or a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Fourteenth Configuration)

A fourteenth configuration of the invention is a substrate with a multilayer reflective film according to the thirteenth configuration, wherein the substrate with a multilayer reflective film has a protective film on the multilayer reflective film.

According to the fourteenth configuration, the substrate with a multilayer reflective film has the protective film on the multilayer reflective film to suppress damages to the multilayer reflective film at the time of fabricating a transfer mask (EUV mask), so that the reflectance characteristics to EUV light become better. The substrate with a multilayer reflective film makes it possible to suppress detection of false defects in the defect inspection of the surface of the protective film using a high-sensitivity defect inspection apparatus, and further make the critical defects more noticeable. In addition, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, or a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Fifteenth Configuration)

A fifteenth configuration of the invention is a substrate with a multilayer reflective film according to the thirteenth or fourteenth configuration, wherein the surface of the multilayer reflective film or the protective film of the substrate with a multilayer reflective film has a power spectrum density of not more than 20 $nm^4$, obtained by measuring an area of 1 µm×1 µm with an atomic force microscope, at a spatial frequency of not less than 1 $µm^{-1}$ and not more than 10 $µm^{-1}$.

According to the fifteenth configuration, it is possible to significantly suppress detection of false defects in the defect inspection of the substrate with a multilayer reflective film using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, thereby making the critical defects more noticeable.

(Sixteenth Configuration)

A sixteenth configuration of the invention is a substrate with a multilayer reflective film according to the thirteenth or fourteenth configuration, wherein the surface of the multilayer reflective film or the protective film of the substrate with a multilayer reflective film has a power spectrum density of not more than 9 $nm^4$, obtained by measuring an area of 1 µm×1 µm with an atomic force microscope, at a spatial frequency of not less than 10 $µm^{-1}$ and not more than 100 $µm^{-1}$.

According to the sixteenth configuration, it is possible to significantly suppress detection of false defects in the defect inspection using a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Seventeenth Configuration)

A seventeenth configuration of the invention is a transmissive mask blank comprising a light shielding function film to be a transfer pattern on the main surface of the mask blank substrate according to any one of the first to fourth configurations.

According to the seventeenth configuration, in the transmissive mask blank, the main surface of the mask blank substrate is configured in such a way that the power spectrum density, which is the amplitude intensity of all roughness components detectable in an area of 1 µm×1 µm, at a spatial frequency of not less than 1 $µm^{-1}$, is set to not more than 10 $nm^4$, making it possible to suppress detection of false defects in the defect inspection using a high-sensitivity defect inspection apparatus, thereby making the critical defects more noticeable. In addition, it is possible to significantly suppress detection of false defects in the defect inspection using a high-sensitivity defect inspection apparatus using an ArF excimer laser with an inspection light source wavelength of 193 nm.

(Eighteenth Configuration)

An eighteenth configuration of the invention is a reflective mask blank comprising an absorber film to be a transfer pattern on the multilayer reflective film or the protective film of the substrate with a multilayer reflective film according to any one of the eighth to sixteenth configurations.

According to the eighteenth configuration, it is possible to suppress detection of false defects in the defect inspection on the reflective mask blank using a high-sensitivity defect inspection apparatus, and further make the critical defects more noticeable. In addition, it is possible to significantly suppress detection of false defects in the defect inspection using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, or a high-sensitivity defect inspection apparatus with inspection light (EUV light) in the wavelength range of 0.2 nm to 100 nm, e.g., a high-sensitivity defect inspection apparatus with EUV light with an inspection light source wavelength of 13.5 nm.

(Nineteenth Configuration)

A nineteenth configuration of the invention is a transmissive mask comprising a light shielding function film pattern provided on the main surface by patterning the light shielding function film of the transmissive mask blank according to the seventeenth configuration.

(Twentieth Configuration)

A twentieth configuration of the invention is a reflective mask comprising an absorber pattern provided on the multilayer reflective film by patterning the absorber film of the reflective mask blank according to the eighteenth configuration.

According to the nineteenth and twentieth configurations, it is possible to suppress detection of false defects in the defect inspection on the transmissive mask and the reflective mask using a high-sensitivity defect inspection apparatus, making the critical defects more noticeable.

(Twenty-First Configuration)

A twenty-first configuration of the invention is a method of manufacturing a semiconductor device, comprising a step of forming a transfer pattern on a transferred substrate using the transmissive mask according to the nineteenth configuration by performing a lithography process using an exposure device.

(Twenty-Second Configuration)

A twenty-second configuration of the invention is a method of manufacturing a semiconductor device, comprising a step of forming a transfer pattern on a transferred substrate using the reflective mask according to the twentieth configuration by performing a lithography process using an exposure device.

According to the twenty-first and twenty-second configurations, a transmissive mask or a reflective mask from which critical defects such as a foreign matter or scratches is removed can be used in defect inspection using a high-sensitivity defect inspection apparatus, so that a transfer pattern such as a circuit pattern to be transferred onto a resist film formed on a transferred substrate such as a semiconductor substrate is free of defects. This makes it possible to manufacture a semiconductor device having a fine and high-precision transfer pattern.

Effects of the Invention

The mask blank substrate, a substrate with a multilayer reflective film, the transmissive mask blank, the reflective mask blank, the transmissive mask and the reflective mask according to the invention permit detection of false defects originating from the surface roughness of a substrate and a film to be suppressed in defect inspection using a high-sensitivity defect inspection apparatus, and facilitate the detection of critical defects such as foreign matters and scratches. In the mask blank substrate, the substrate with a multilayer reflective film, the reflective mask blank and the reflective mask for use in EUV lithography, in particular, the multilayer reflective film formed on the main surface of the substrate provides high reflectance while suppressing false defects.

According to the above-described method of manufacturing a semiconductor device, a reflective mask or a transmissive mask from which critical defects such as a foreign matter or scratches is removed can be used in defect inspection using a high-sensitivity defect inspection apparatus, so that a transfer pattern such as a circuit pattern to be formed on a transferred substrate such as a semiconductor substrate is free of defects. This makes it possible to manufacture a semiconductor device having a fine and high-precision transfer pattern.

Description of Illustrated Embodiments

[Mask Blank Substrate]

A mask blank substrate according to an exemplary embodiment of the present invention is described as follows.

FIG. 1(a) is a perspective view illustrating a mask blank substrate 10 according to an exemplary embodiment of the present invention. FIG. 1(b) is a schematic cross-sectional view illustrating the mask blank substrate 10 of the present embodiment.

A mask blank substrate 10 (or simply referred to as substrate 10) is a rectangular plate-like body, and includes two opposite main surfaces 2 and end faces 1. The two opposite main surfaces 2 are an upper surface and a lower surface of the plate-like body, and are formed so as to face each other. At least one of the two opposite main surfaces 2 is the main surface where a transfer pattern is formed.

The end faces 1 are side surfaces of the plate-like body, and are adjacent to the outer edges of the opposite main surfaces 2. The end face 1 has a flat end face portion 1d and a curved end face portion 1f. The flat end face portion 1d is a surface connecting the side of one opposite main surface 2 and the side of the other opposite main surface 2, and includes a side surface portion 1a and a chamfered inclined surface portion 1b. The side surface portion 1a is that portion (T side) in the flat end face portion 1d which is substantially perpendicular to the opposing main surfaces 2. The chamfered inclined surface portion 1b is a chamfered portion (C side) between the side surface portion 1a and the opposite main surface 2, and is formed between the side surface portion 1a and the opposite main surface 2.

The curved end portions 1f is a portion (R portion) adjacent to the vicinity of a corner portion 10a of the substrate 10 in a plan view of the substrate 10, and includes a side surface portion 1c and a chamfered inclined portion 1e. The plan view of the substrate 10 is, for example, is to see the substrate 10 from a direction perpendicular to the opposite main surface 2. Further, the corner portion 10a of the substrate 10 is, for example, the vicinity of the intersection of the two sides at the outer edge of the opposite main surface 2. The intersection of the two sides may be the intersection of the extensions of the two sides. In this embodiment, the curved end portion 1f is formed into a curved shape by rounding the corner portion 10a of the substrate 10.

To achieve the above objects, this embodiment is characterized in that at least the main surface on which a transfer pattern is formed, that is, the main surface on that side of a transmissive mask blank 50 where a light shielding function film 51 is formed, or the main surface on that side of a reflective mask blank 30 where a multilayer reflective film 21, a protective film 22, and an absorber film 24 are formed, as described later, has a certain surface roughness and a certain power spectrum density (PSD).

The surface roughnesses (Rmax, Rms) and power spectrum density (PSD), which are parameters representing the surface states of the main surfaces of the mask blank substrate 10 of this embodiment, are described as follows.

First, Rms (Root Means Square), which is a representative index of the surface roughness, is the root mean square roughness that is the square root of the mean value of the square of the deviation from an average line to a measurement curve. Rms is expressed by the following equation (1).

[Eq. 1]

$$\text{Rms} = \sqrt{\frac{1}{l}\int_0^l Z^2(x)dx} \qquad (1)$$

In the equation (1), l is a reference length, and Z is the height from the average line to the measurement curve.

Rmax, which is likewise a representative index of the surface roughness, is the height of the maximum surface roughness, Rmax is the maximum height of the surface roughness or the difference between the absolute value of the maximum value of the height of the crest of the roughness curve and the absolute value of the maximum value of the depth of the trough of the roughness curve.

Rms and Rmax have been used to manage the surface roughness of the mask blank substrate 10, and are excellent in that the surface roughness can be grasped by a numeral. However, Rms and Rmax are both height information and do not include information about a change in a fine surface shape.

By contrast, power spectrum analysis, which converts an obtained roughness of the surface to the spatial frequency region to represent the surface roughness by the amplitude intensity in terms of the spatial frequency, can quantify a fine surface shape. It is provided that Z (x, y) is data on the heights of the x coordinate and the y coordinate, Fourier transform of Z (x, y) is given by the following equation (2).

[Eq. 2]

$$F(u,v) = \frac{1}{N_x N_y} \sum_{u=0}^{N_x-1} \sum_{v=0}^{N_y-1} Z(x,y)\exp\left[-i2\pi\left(\frac{ux}{N_x} + \frac{vy}{N_y}\right)\right] \qquad (2)$$

where Nx and Ny are the numbers of data in the x and y directions. At u=0, 1, 2··Nx−1, and v=0, 1, 2·Ny−1, the spatial frequency f is given by the following equation (3).

[Eq. 3]

$$f = \left\{ \left[ \frac{u}{(N_x - 1)d_x} \right]^2 + \left[ \frac{v}{(N_y - 1)d_y} \right]^2 \right\}^{1/2} \quad (3)$$

In the equation (3), dx is the minimum resolution of the x direction, and dy is the minimum resolution in the y direction.

The power spectrum density PSD in this case is given by the following equation (4).

[Eq. 4]

$$P(u,v) = |F(u,v)|^2 \quad (4)$$

The power spectral analysis is excellent in that the main surfaces 2 of the substrate 10 and a change in the surface state of a film, which will be described later, can be grasped not only as a simple change in height but also a change in spatial frequency. The power spectral analysis is a method to analyze the influence of microscopic reactions at the atomic level on the surface.

To achieve the aforementioned objects, the mask blank substrate 10 according to this embodiment is configured so that the main surface on which a transfer pattern is formed is expressed in terms of the aforementioned surface roughness (Rms) and power spectrum density, and has a root mean square roughness (Rms) of not more than 0.15 nm obtained by measuring an area of 1 μm×1 μm with an atomic force microscope, and has a power spectrum density of not more than 10 nm$^4$ at a spatial frequency of not less than 1 μm$^{-1}$.

According to the present invention, the area of 1 μm×1 μm may be an arbitrary location of the area where the transfer pattern is formed. When the substrate 10 has a size of 6025 (152.4 mm×152.4 mm×6.35 mm), for example, the area may be an area of 142 mm×142 mm, an area of 132 mm×132 mm, or an area of 132 mm×104 mm, excluding the peripheral area of the main surface of the substrate 10. Further, the arbitrary location may be, for example, a central area of the main surface of the substrate 10.

The above-described area of 1 μm×1 μm, transfer-pattern forming area, and arbitrary location may be applied to the multilayer reflective film 21 and the protective film 22 of a substrate with a multilayer reflective film 20, an absorber film 24 of a reflective mask blank 30, and a light shielding function film 51 in a transmissive mask blank 50, which will be described later.

When defect inspection of the main surface of the mask blank substrate 10 is performed using a high-sensitivity defect inspection apparatus with inspection light in the wavelength range of 150 nm to 365 nm, e.g., a UV laser with an inspection light source wavelength of 266 nm or an ArF excimer laser with an inspection light source wavelength of 193 nm, it is desirable that the main surface should preferably have a power spectrum density of not more than 10 nm$^4$, obtained by measuring an area of 1 μm×1 μm with an atomic force microscope, at a spatial frequency of not less than 1 μm$^{-1}$ and not more than 10 μm$^{-1}$, more preferably, a power spectrum density of not less than 1 nm$^4$ and not more than 10 nm$^4$ at a spatial frequency of not less than 1 μm$^{-1}$ and not more than 10 μm$^{-1}$, more preferably, a power spectrum density of not less than 1 nm$^4$ and not more than 8 nm$^4$ at a spatial frequency of not less than 1 μm$^{-1}$ and not more than 10 μm$^{-1}$, and more preferably, a power spectrum density of not less than 1 nm$^4$ and not more than 6 nm$^4$ at a spatial frequency of not less than 1 μm$^{-1}$ and not more than 10 μm$^{-1}$.

Further, it is desirable that the aforementioned root mean square roughness (Rms) should preferably be not more than 0.12 nm, more preferably, not more than 0.10 nm, more preferably, not more than 0.08 nm, and more preferably, not more than 0.06 nm. In addition, it is desirable that the maximum height (Rmax) should preferably be not more than 1.2 nm, more preferably, not more than 1.0 nm, more preferably, not more than 0.8 nm, and more preferably, not more than 0.6 nm. From the viewpoint of improvements on the optical properties such as the reflectivities of the multilayer reflective film 21, the protective film 22, the absorber film 24 and the light shielding function film 51 formed on the mask blank substrate 10, it is preferable to manage both parameters, the root mean square roughness (Rms) and the maximum height (Rmax). For example, it is desirable that the preferable surface roughness of the mask blank substrate 10 should preferably be such that the root mean square roughness (Rms) is preferably not more than 0.12 nm and the maximum height (Rmax) is not more than 1.2 nm, more preferably, the root mean square roughness (Rms) is not more than 0.10 nm and the maximum height (Rmax) is not more than 1.0 nm, more preferably, the root mean square roughness (Rms) is not more than 0.08 nm and the maximum height (Rmax) is not more than 0.8 nm, and more preferably, the root mean square roughness (Rms) is not more than 0.06 nm and the maximum height (Rmax) is not more than 0.6 nm.

Further, it is preferable that the main surface of the substrate 10 should be a surface treated by catalyst-referred etching. CAtalyst-Referred Etching (hereinafter also referred to as CARE) is a surface treatment method selectively removing fine convex portions present on the main surface to smooth the main surface by active species generated from the molecules of the treatment liquid which are adsorbed to the catalyst, by making the main surface of the substrate 10 and the catalyst to move closer or come in contact with each other while a treatment fluid that do not exhibit solubility in a normal state is interposed between the main surface of the substrate 10 and the catalyst.

According to the fourth configuration, because the main surface of the substrate 10 is selectively subjected to a surface treatment from convex portions contacting the surface of the catalyst which is a reference surface by catalyst-referred etching, irregularities (surface roughness) forming the main surface become highly aligned surface states while being kept very smooth, and become such surface states that the ratio of concave portions is greater than the ratio of convex portions with respect to the reference surface. When a plurality of thin films are laminated on the main surface, the size of defects on the main surface tend to become smaller, which is preferable from the viewpoint of the defect quality. Particularly, the effect is demonstrated when a multilayer reflective film to be described later is formed on the main surface. Further, execution of a surface treatment to the main surface by catalyst-referred etching as mentioned above makes it possible to relatively easily form the surface with the surface roughness and the bearing curve characteristics as defined in the first or second configuration.

When the material for the substrate 10 is a glass material, at least one material selected from the group of platinum, gold, a transition metal, and an alloy comprising at least one thereof may be available as the catalyst. Further, at least one solution selected from the group of functional water such as pure water, ozone water or hydrogen water, a low-concentration alkaline aqueous solution, and a low-concentration acidic aqueous solution may be available as the treatment solution.

With the surface roughness of the main surface and the power spectrum density being set in the above-described ranges, as described above, it is possible to significantly suppress detection of false defects in defect inspection with, for example, the mask substrate/blank defect inspection apparatus "MAGICS M7360" for EUV exposure of Lasertec Corp. (inspection light source wavelength: 266 nm), the reticle, the optical mask/blank and the EUV mask/blank defect inspection apparatus "Teron 600 series" of KLA-Tencor Corp. (inspection light source wavelength: 193 nm).

It is noted that the inspection light source wavelength is not limited to 266 nm and 193 nm. 532 nm, 488 nm, 364 nm, and 257 nm may be used as the inspection light source wavelength.

The mask blank substrates to be subjected to defect inspection using a high-sensitivity defect inspection apparatus with the inspection light source wavelength described above include a transmissive mask blank substrate, and a reflective mask blank substrate.

When defect inspection of the main surface of the mask blank substrate 10 is performed using a high-sensitivity defect inspection apparatus with inspection light (EUV light) in the wavelength range of 0.2 nm to 100 nm, e.g., a high-sensitivity defect inspection apparatus with UV light with an inspection light source wavelength of 13.5 nm, it is desirable that the main surface should more preferably have a power spectrum density of not more than 5 nm$^4$, obtained by measuring an area of 1 μm×1 μm with an atomic force microscope, at a spatial frequency of not less than 10 μm$^{-1}$ and not more than 100 μm$^{-1}$, more preferably, a power spectrum density of not less than 0.5 nm$^4$ and not more than 5 nm$^4$ at a spatial frequency of not less than 10 μm$^{-1}$ and not more than 100 μm$^{-1}$. It is noted that when defect inspection of the main surface of the mask blank substrate 10 is performed using a high-sensitivity defect inspection apparatus with EUV light, a predetermined reflectance or higher is needed so that the material is limited to one other than glass.

With the surface roughness of the main surface and the power spectrum density being set in the above-described ranges, as described above, it is possible to significantly suppress detection of false defects in defect inspection using, for example, a high-sensitivity defect inspection apparatus with EUV light with an inspection light source wavelength of 13.5 nm.

The mask blank substrate 10 to be subjected to defect inspection using a high-sensitivity defect inspection apparatus with the aforementioned inspection light wavelength includes a reflective mask blank substrate.

It is preferable that the main surface of the mask blank substrate 10 according to this embodiment on which a transfer pattern is formed should be treated to have a high flatness at least from the viewpoint of obtaining the pattern transfer accuracy and position precision. For an EUV reflective mask blank substrate, it is preferable that the flatness of an area of 132 mm×132 mm or an area of 142 mm×142 mm of the main surface of the substrate 10 on which a transfer pattern is formed should be not more than 0.1 μm, particularly preferably, not more than 0.05 μm. It is more preferable that the flatness of an area of 132 mm×132 mm of the main surface where a transfer pattern is formed should be not more than 0.03 μm. Further, the main surface opposite to the main surface of the substrate 10 on which a transfer pattern is formed is a surface that is electrostatically chucked when the substrate 10 is set in the exposure apparatus, the flatness of an area of 142 mm×142 mm is not more than 1 μm, particularly preferably, not more than 0.5 μm. For the mask blank substrate 10 to be used for a transmissive mask blank for exposure by an ArF excimer laser, the flatness of an area of 132 mm×132 mm or an area of 142 mm×142 mm of the main surface of the substrate 10 on which a transfer pattern is formed should be not more than 0.3 μm, particularly preferably, not more than 0.2 μm.

Any material transparent to the exposure wavelength is available as a material for a transmissive mask blank substrate for exposure by an ArF excimer laser. In general, synthetic quartz glass is used. Other available materials may be aluminosilicate glass, soda-lime glass, borosilicate glass, and non-alkali glass.

Any material having a low thermal expansion property is available as a material for a reflective mask blank substrate for EUV exposure. For example, a $SiO_2$—$TiO_2$ glass (2-element based ($SiO_2$—$TiO_2$) and 3-element based ($SiO_2$—$TiO_2$—$SnO_2$ or the like)), e.g., what is called multi-element glass such as $SiO_2$—$Al_2O_3$—$Li_2O$ based crystallized glass, is available. In addition, a substrate of silicon or metal in addition to a glass substrate may be used. Examples of the metal substrate include an Invar alloy (Fe—Ni-based alloy).

As described above, because the mask blank substrate for EUV exposure needs low thermal expansion characteristics, is required in the substrate, a multi-element glass material is used; however, this material undesirably has a difficulty in obtaining high smoothness as compared with synthetic silica glass. To solve this problem, a thin film made of a metal, an alloy or a material containing at least one of oxygen, nitrogen, carbon contained in either the metal or the alloy is formed on a substrate made of a multi-element glass material. Then, the surface of such a thin film is subjected to mirror polishing and a surface treatment, making it possible to relatively easily form a surface with the surface roughness and the power spectrum density in the aforementioned range.

As the material for the thin film, for example, Ta (tantalum), an alloy containing Ta or a Ta compound containing at least one of oxygen, nitrogen, carbon contained in either the metal or the alloy is preferable. As the Ta compound, for example, TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON and the like may be used. Of these Ta compounds, TaN, TaON, TaCON, TaBN, TaBON, TaBCON, TaHfN, TaHfON, TaHfCON, TaSiN, TaSiON, and TaSiCON containing nitrogen (N) are more preferable. It is desirable that in view of the high smoothness of the surface of the thin film, the thin film should have an amorphous structure. The crystal structure of the thin film can be measured by X-ray diffractometer (XRD).

The processing method for obtaining the surface roughness and power spectrum density as specified above is not particularly limited in the invention. The invention is characterized in that the surface roughness and the power spectrum density of the mask blank substrate are managed, which may be achieved by, for example, processing methods illustrated in Examples 1 to 3 and 5 to be described later.

[Substrate with a Multilayer Reflective Film]

The substrate with a multilayer reflective film 20 according to an exemplary embodiment of the invention is described as follows.

Figure 2:
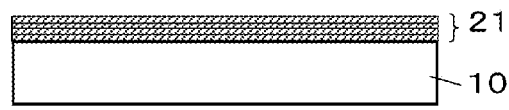
FIG. 2 is a schematic cross-sectional view illustrating an example of the configuration of a substrate with a multilayer reflective film according to an exemplary embodiment of the present invention.

FIG. 2 is a schematic diagram illustrating a substrate with a multilayer reflective film 20 according to this embodiment.

The substrate with a multilayer reflective film 20 according to the embodiment has a structure in which the multilayer reflective film 21 is provided on the main surface of the above-described mask blank substrate 10 where a transfer pattern is formed. This multilayer reflective film 21 provides a reflective mask for EUV lithography with the capability of reflecting EUV light, and has a structure of a multilayer reflective film having elements of different reflectances laminated periodically.

The material for the multilayer reflective film 21 is not particularly limited as long as it reflects EUV light; the reflective multilayer film 21 generally has a reflectance of not less than 65% by itself, and has an upper reflectance limit of 73%. In general, such a multilayer reflective film 21 may have thin films made of a material with a high refractive index (high refractive index layers) and thin films made of a material with a low refractive index (low refractive index layers) alternately laminated by about 40 to 60 periods.

For example, it is preferable that the multilayer reflective film 21 for EUV light with a wavelength of 13 nm to 14 nm is an Mo/Si periodic multilayer film having Si films and Mo films alternately laminated by about 40 periods. As other multilayer reflective films for use in the region of EUV light, an Ru/Si periodic multilayer film, an Mo/Be periodic multilayer film, an Mo compound/Si compound periodic multilayer film, a Si/Nb periodic multilayer film, a Si/Mo/Ru periodic multilayer film, a Si/Mo/Ru/Mo periodic multilayer film, and a Si/Ru/Mo/Ru periodic multilayer film are available.

The methods of forming the multilayer reflective film 21 are known in the art; for example, the multilayer reflective film 21 may be formed by depositing individual layers by magnetron sputtering, ion beam sputtering or the like. For the aforementioned Mo/Si periodic multilayer film, for example, the multilayer reflective film 21 is formed by ion beam sputtering to deposit a film with a thickness of about several nanometers on the substrate 10 using a Si target first, then deposit a Mo film with a thickness of about several nanometers using an Mo target, as one period, and then laminate those two films by 40 to 60 periods.

To protect the multilayer reflective film 21 from dry etching or wet cleaning in the process of manufacturing a reflective mask for EUV lithography, the protective film 22 (see FIG. 3) may be formed on the multilayer reflective film 1 formed as described above. The structure with the multilayer reflective film 21 and the protective film 22 on the mask blank substrate 10 may be included in the substrate with a multilayer reflective film according to invention.

As the material for the protective film 22, for example, materials such as Ru, Ru—(Nb, Zr, Y, B, Ti, La, Mo), Si—(Ru, Rh, Cr, B), Si, Zr, Nb, La and B can be used. Of the materials, if those containing ruthenium (Ru) applied, reflectance characteristics of the multilayer reflective film become better. Specifically, Ru and Ru—(Nb, Zr, Y, B, Ti, La, Mo) are preferred. Such a protective film is particularly effective when the absorber film is formed of a Ta-based material and is patterned by dry etching with Cl-based gas.

It is preferable that the surface of the multilayer reflective film 21 or the protective film 22 of the substrate with a multilayer reflective film 20 should have a power spectrum density of not more than 20 nm$^4$, obtained by measuring an area of 1 μm×1 μm with an atomic force microscope, at a spatial frequency of not less than 1 μm and not more than 10 μm$^{-1}$. This configuration makes it possible to suppress detection of false defects in the defect inspection of the surface of the multilayer reflective film 21 or the protective film 22 using a high-sensitivity defect inspection apparatus, thereby making the critical defects more noticeable. It is desirable that the surface of the multilayer reflective film 21 or the protective film 22 should more preferably have a power spectrum density of not more than 17 nm$^4$, obtained by measuring an area of 1 μm×1 μm with an atomic force microscope, at a spatial frequency of not less than 1 μm$^{-1}$ and not more than 10 μm$^{-1}$, more preferably, a power spectrum density of not more than 15 nm$^4$, obtained by measuring an area of 1 μm×1 μm with an atomic force microscope, at a spatial frequency of not less than 1 μm$^{-1}$ and not more than 10 μm$^{-1}$, more preferably, a power spectrum density of not more than 10 nm$^4$, obtained by measuring an area of 1 μm×1 μm with an atomic force microscope, at a spatial frequency of not less than 1 μm$^{-1}$ and not more than 10 μm$^{-1}$, and more preferably, a power spectrum density of not less than 1 nm$^4$ and not more than 10 nm$^4$, obtained by measuring an area of 1 μm×1 μm with an atomic force microscope, at a spatial frequency of not less than 1 μm$^{-1}$ and not more than 10 μm$^{-1}$. This configuration makes it possible to significantly suppress detection of false defects when defect inspection of the substrate with a multilayer reflective film 20 is performed using a high-sensitivity defect inspection apparatus with inspection light in the wavelength range of 150 nm to 365 nm, e.g., a high-sensitivity defect inspection apparatus using a UV laser with an inspection light source wavelength of 266 nm or an ArF excimer laser with an inspection light source wavelength of 193 nm.

It is preferable that the surface of the multilayer reflective film 21 or the protective film 22 of the substrate with a multilayer reflective film 20 should have a power spectrum density of not more than 9 nm$^4$, obtained by measuring an area of 1 μm×1 μm with an atomic force microscope, at a spatial frequency of not less than 10 μm$^{-1}$ and not more than 100 μm$^{-1}$. It is desirable that the surface of the multilayer reflective film 21 or the protective film 22 should more preferably have a power spectrum density of not more than 8 nm$^4$, obtained by measuring an area of 1 μm×1 μm with an atomic force microscope, at a spatial frequency of not less than 10 μm$^{-1}$ and not more than 100 μm$^{-1}$, more preferably, a power spectrum density of not more than 7 nm$^4$, obtained by measuring an area of 1 μm×1 μm with an atomic force microscope, at a spatial frequency of not less than 10 μm$^{-1}$ and not more than 100 μm$^{-1}$, more preferably, a power spectrum density of not more than 5 nm$^4$, obtained by measuring an area of 1 μm×1 μm with an atomic force microscope, at a spatial frequency of not less than 10 μm$^{-1}$ and not more than 100 μm$^{-1}$, and more preferably, a power spectrum density of not less than 0.5 nm$^4$ and not more than 5 nm$^4$, obtained by measuring an area of 1 μm×1 μm with an atomic force microscope, at a spatial frequency of not less than 10 μm$^{-1}$ and not more than 100 μm$^{-1}$. This configuration makes it possible to significantly suppress detection of false defects when defect inspection of the substrate with a multilayer reflective film is performed using a high-sensitivity defect inspection apparatus with inspection light (EUV light) in the wavelength range of 0.2 nm to 100 nm, e.g., a high-sensitivity defect inspection apparatus using EUV light with an inspection light source wavelength of 13.5 nm.

To make the reflectance characteristics needed for the substrate with a multilayer reflective film in addition to the effect of significantly suppressing detection of false defects in defect inspection using the aforementioned high-sensitivity defect inspection apparatus, it is preferable that the surface of the multilayer reflective film 21 or the protective layer 22 should have a root mean square roughness (Rms) of not more than 0.15 nm, obtained by measuring an area of 1 μm×1 μm with an atomic force microscope. It is desirable that the root mean square roughness (Rms) should more preferably be not more than 0.13 nm, and the root mean square roughness (Rms) should more preferably be not more than 0.12 nm.

To permit the surface of the multilayer reflective film 21 or the protective film 22 to have a power spectrum density in the aforementioned range while maintaining the surface state of the substrate 10 in the aforementioned range, the multilayer reflective film 21 is deposited by obliquely depositing a high refractive index layer and a low refractive index layer with respect to the normal line of the main surface of the substrate 10. More specifically, deposition is performed by ion beam sputtering in such a way that the incident angle of sputtered particles for deposition of high refractive index layers constituting the multilayer reflective film 21 becomes greater than the incident angle of sputtered particles for deposition of low refractive index layers with respect to the normal line of the main surface of the substrate 10. In further details, the incident angle of sputtered particles for deposition of low refractive index layers of Mo or the like should be not less than 40 degrees and less than 90 degrees, and the incident angle of sputtered particles for the deposition of high refractive index layer of Si or the like should be not less than 0 degrees and not more than 60 degrees. Furthermore, the protective film 22 that is formed on the multilayer reflective film 21 is consecutively formed after deposition of the multilayer reflective film 21 in such a way that the protective film 22 is deposited obliquely with respect to the normal line of the main surface of the substrate 10.

Further, for the substrate 10 whose surface state does not lie within the aforementioned range, or to suppress detection of false defects in high-sensitivity defect inspection of the multilayer reflective film 21 or the protective film 22, the multilayer reflective film 21 should be deposited with the incident angle of sputtered particles for deposition of a low refractive index layer of Mo or the like and the incident angle of sputtered particles for deposition of a high refractive index layer of Si or the like being set to small angles, e.g., not less than 0 degrees and not more than 30 degrees.

A back-side conductive film 23 (see FIG. 3) may be formed on that side of the substrate with a multilayer reflective film 20 which is opposite to the side contacting the multilayer reflective film 21 of the substrate 10 for the purpose of electrostatic chuck. The structure with the multilayer reflective film 21 and the protective film 22 on that side of the mask blank substrate 10 where a transfer pattern is formed, and the back-side conductive film 23 is provided on that side which is opposite to the side contacting the multilayer reflective film 21 may be included in the substrate with a multilayer reflective film according to invention. The electrical property (sheet resistance) required for the back-surface conductive film 23 is typically not more than 100Ω/□. The method of forming the back-side conductive film 23 is known; for example, the back-side conductive film 23 may be formed by magnetron sputtering or ion beam sputtering method by using a target of metal or an alloy of Cr, Ta or the like.

As the substrate with a multilayer reflective film 20 according to the embodiment, a base layer (an under layer) may be formed between the substrate 10 and the multilayer reflective film 21. The base layer may be formed for the purposes of improving smoothness of the main surface of the substrate 10, reducing defects, increasing the reflectance of the multilayer reflective film 21, and correcting the stress on the multilayer reflective film 21.

[Reflective Mask Blank]

Next, the reflective mask blank 30 according to an exemplary embodiment of the present invention is described below.

Figure 3:
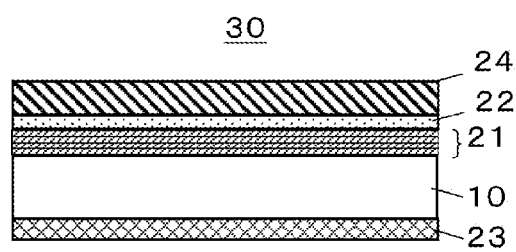
FIG. 3 is a schematic cross-sectional view illustrating an example of the configuration of a reflective mask blank according to an exemplary embodiment of the present invention.

FIG. 3 is a schematic diagram illustrating the reflective mask blank 30 according to this embodiment.

The reflective mask blank 30 according to the embodiment is configured to have the absorber film 24, to be a transfer pattern, formed on the protective layer 22 of the above-described substrate with a multilayer reflective film 20.

The material for the absorber film 24 is not particularly limited. For example, it is preferable to use Ta (tantalum) alone or those containing Ta as the main component among materials capable of absorbing EUV light. Usually, the material containing Ta as the main component is a Ta alloy. The crystalline state of such an absorber film should preferably have an amorphous or microcrystalline structure from the viewpoint of the smoothness and the flatness. As the material containing Ta as the main component, for example, a material containing Ta and B, a material containing Ta and N, a material containing Ta and B and further containing at least one of O and N, a material containing Ta and Si, a material containing Ta, Si and N, a material containing Ta and Ge, and a material containing Ta, Ge and N may be used. In addition, adding B, Si, Ge or the like to Ta easily provides an amorphous structure, which improves the smoothness. Further, adding N or O to Ta improves resistance against oxidation, making it possible to improve the stability over time. To permit the surface of the absorber film 24 to have a power spectrum density in the aforementioned range while maintaining the surface states of the substrate 10 and the substrate with a multilayer reflective film 20 in the aforementioned ranges, the absorber film 24 should preferably have an amorphous structure. The crystal structure can be observed with an X-ray diffractometer (XRD).

It is desirable that the surface of the absorber film 24 should preferably have a power spectrum density of not more than 10 $nm^4$, obtained by measuring an area of 1 μm×1 μm with an atomic force microscope, at a spatial frequency of not less than 1 μm and not more than 10 $μm^{-1}$, more preferably, a power spectrum density of not less than 1 $nm^4$ and not more than 10 $nm^4$, obtained by measuring an area of 1 μm×1 μm with an atomic force microscope, at a spatial frequency of not less than 1 $μm^{-1}$ and not more than 10 $μm^{-1}$. This configuration makes it possible to significantly suppress detection of false defects when defect inspection of the reflective mask blank 30 is performed using a high-sensitivity defect inspection apparatus with inspection light in the wavelength range of 150 nm to 365 nm, e.g., a high-sensitivity defect inspection apparatus using a UV laser with an inspection light source wavelength of 266 nm or an ArF excimer laser with an inspection light source wavelength of 193 nm.

It is preferable that the surface of the absorber film 24 should preferably have more preferably, a power spectrum density of not more than 5 $nm^4$, obtained by measuring an area of 1 μm×1 μm with an atomic force microscope, at a spatial frequency of not less than 10 $μm^{-1}$ and not more than 100 $μm^{-1}$, and more preferably, a power spectrum density of not less than 0.5 $nm^4$ and not more than 5 $nm^4$, obtained by measuring an area of 1 μm×1 μm with an atomic force microscope, at a spatial frequency of not less than 10 $μm^{-1}$ and not more than 100 $μm^{-1}$. This configuration makes it possible to significantly suppress detection of false defects when defect inspection of the reflective mask blank 30 is performed using a high-sensitivity defect inspection apparatus with inspection light (EUV light) in the wavelength range of 0.2 nm to 100 nm, e.g., a high-sensitivity defect inspection apparatus using EUV light with an inspection light source wavelength of 13.5 nm.

The reflective mask blank according to the invention is not limited to the configuration illustrated in FIG. 3. For example, a resist film to be a mask for patterning the absorber film 24 may be formed on the absorber film, so that the reflective mask blank with resist-film 30 may be regarded as the reflective mask blank according to the invention. The resist film to be formed on the absorber film 24 may be a positive type or a negative type. Further, the reflective mask blank may be used for laser drawing as well as for electron beam writing. Furthermore, what is called a hard mask film (an etching mask film) may be formed between the absorber film 24 and the resist film, and this structure may also be included in the reflective mask blank according to invention.

[Reflective Mask]

Next, a reflective mask 40 according to an exemplary embodiment of the present invention is described below.

Figure 4:
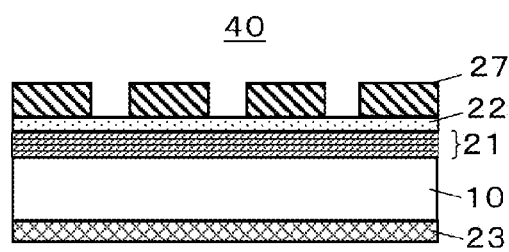
FIG. 4 is a schematic cross-sectional view illustrating an example of a reflective mask according to an exemplary embodiment of the present invention.

FIG. 4 is a schematic diagram illustrating the reflection type mask 40 of this embodiment.

The reflective mask 40 according to this embodiment is configured to have an absorber pattern 27 formed on the protective film 22 by patterning the absorber film 24 in the reflective mask blank 30. When the reflective mask 40 according to the embodiment is exposed with exposure light such as EUV light, the exposure light is absorbed at a portion of the mask surface where the absorber film 24 is present, and the exposure light is reflected by the protective film 22 and the multilayer reflective film 21 at the other portion where the absorber film 24 is removed. Accordingly, the reflective mask 40 can be used as the reflective mask 40 for lithography.

[Transmissive Mask Blank]

A transmissive mask blank 50 according to an exemplary embodiment of the present invention is described as follows.

Figure 5:
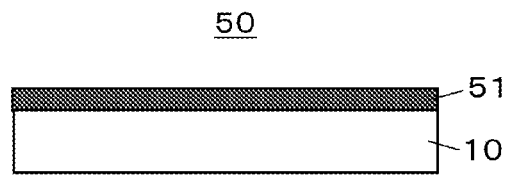
FIG. 5 is a schematic cross-sectional view illustrating an example of the configuration of a transmissive mask blank according to an exemplary embodiment of the present invention.

FIG. 5 is a schematic diagram illustrating the transmissive mask blank 50 according to this embodiment.

The transmissive mask blank 50 according to the embodiment configured to have a light shielding function film 51, to be a transfer pattern, formed on the main surface on that side of the above-described mask blank substrate 10 where a transfer pattern is formed.

Examples of the transmissive mask blank 50 include a binary mask blank, and a phase shift mask blank. Examples of the light shielding function film 51 include what is called a halftone film that attenuates exposure light and shifts the phase in addition to the light shielding film capable of blocking the exposure light.

The binary mask blank is obtained by depositing a light shielding film for shielding the exposure light on the mask blank substrate 10. This light shielding film is patterned to form a desired transfer pattern. Examples of the light shielding film include a Cr film, a Cr alloy film containing optionally oxygen, nitrogen, carbon or fluorine in Cr, a film having lamination thereof, a MoSi film, and a MoSi alloy film optionally containing oxygen, nitrogen or carbon in MoSi, and a film having lamination thereof. An antireflection layer having an antireflection function may be included in the surface of the light shielding film.

The phase-shift mask blank is obtained by depositing a phase shift film for changing the phase difference of the exposure light on the mask blank substrate 10. This phase shift film is patterned to form a desired transfer pattern. Examples of the phase shift film include, in addition to a $SiO_2$ film having only a phase shift capability, a halftone film having a light shielding capability and a phase shift capability, such as a metal silicide oxide film, a metal silicide nitride film, a metal silicide oxynitride film, a metal silicide oxide carbide film, a metal silicide oxynitride carbide film (metal: transition metal such as Mo, Ti, W or Ta), a CrO film, a CrF film or a SiON film. The structure with the light shielding film formed on the phase shift film may be included in the phase-shift mask blank.

The transmissive mask blank 50 according to the invention is not limited to the configuration illustrated in FIG. 5. For example, a resist film, to be a mask for patterning the light shielding function film 51, may be formed on the light shielding function film 51, so that the transmissive mask blank with the resist film may be regarded as the transmissive mask blank according to the invention. As in the above-described case, the resist film formed on the light shielding function film 51 may be of a positive type or a negative type. Further, the transmissive mask blank may be used for laser drawing as well as for electron beam writing. Furthermore, what is called a hard mask film (an etching mask film) may be formed between the light shielding function film 51 and the resist film, and this structure may also be included in the transmissive mask blank according to invention.

It is desirable that the surface of the light shielding function film 51 in the aforementioned transmissive mask blank 50 should preferably have a power spectrum density of not more than 10 $nm^4$, obtained by measuring an area of 1 μm×1 μm with an atomic force microscope, at a spatial frequency of not less than 1 $μm^{-1}$ and not more than 10 $μm^{-1}$, more preferably, a power spectrum density of not less than 1 $nm^4$ and not more than 10 $nm^4$, obtained by measuring an area of 1 μm×1 μm with an atomic force microscope, at a spatial frequency of not less than 1 $μm^{-1}$ and not more than 10 $μm^{-1}$. This configuration makes it possible to significantly suppress detection of false defects when defect inspection of the transmissive mask blank 50 is performed using a high-sensitivity defect inspection apparatus with inspection light in the wavelength range of 150 nm to 365 nm, e.g., a high-sensitivity defect inspection apparatus using an ArF excimer laser with an inspection light source wavelength of 193 nm.

To permit the surface of the light shielding function film 51 to have a power spectrum density in the aforementioned range while maintaining the surface state of the substrate 10 in the aforementioned range, it is preferable that the surface of the light shielding function film 51 should have an amorphous structure. The crystal structure can be observed with an X-ray diffractometer (XRD).

[Transmissive Mask]

A transmissive mask 60 according to an exemplary embodiment of the present invention is described as follows.

Figure 6:
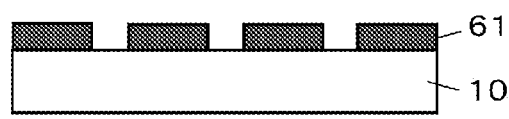
FIG. 6 is a schematic cross-sectional view illustrating an example of a transmissive mask according to an exemplary embodiment of the present invention.

FIG. 6 is a schematic diagram illustrating the transmissive mask 60 according to the present embodiment.

The transmissive mask 60 according to this embodiment is configured to have a light-shielding-function film pattern 61 formed on the mask blank substrate 10 by patterning the light shielding function film 51 in the transmissive mask blank 50. When the transmissive mask 60 according to the embodiment is a binary mask and is exposed with exposure light such as ArF excimer laser light, the exposure light is shielded at a portion of the mask surface where the light shielding function film 51 is present, and the exposure light passes through the mask blank substrate 10 at the other portion where the light shielding function film 51 is removed. Accordingly, the transmissive mask can be used as the transmissive mask 60 for lithography. When a halftone phase shift mask which is one type of phase shift mask is exposed with exposure light such as ArF excimer laser light, the exposure light passes through the exposed mask blank substrate 10 at a portion of the mask surface where the light shielding function film 51 is removed, and the exposure light is attenuated and passes while having a predetermined amount of phase shift at a certain portion of the light shielding function film 51. Accordingly, the transmissive mask can be used as the transmissive mask 60 for lithography. Further, the phase shift mask is not limited to the aforementioned halftone phase shift mask, and may be phase shift masks using various phase-shifting effects, such as a Levenson type phase shift mask.

[Method of Manufacturing Semiconductor Device]

A semiconductor device having various patterns or the like formed on a semiconductor substrate can be manufactured by transferring a transfer pattern that is a circuit pattern or the like based on an absorber pattern 27 of the reflective mask 40 or the light-shielding-function film pattern 61 of the transmissive mask 60, to the resist film formed on the a transfer target such as the semiconductor substrate, by a lithography process using the above-described reflective mask 40 and the transmissive mask 60, and the exposure apparatus, and through various other processes.

It is noted that fiducial marks may be formed on the above-described mask blank substrate 10, substrate with a multilayer reflective film 20, reflective mask blank 30 and transmissive mask blank 50, and the fiducial marks and the locations of critical defects detected with the aforementioned high-sensitivity defect inspection apparatus can be managed based on the coordinates. At the time of fabricating the reflective mask 40 or the transmissive mask blank 50 based on the obtained positional information (defect data), drawing data is corrected based on the defect data and data on the transfer pattern to be transferred (circuit pattern) in such a way that the absorber pattern 27 or the light-shielding-function film pattern 61 is formed at locations where critical defects are present, thereby reducing defects.

EXAMPLES

Examples 1 to 3 and 5 to 7 including the embodiments of the mask blank substrate, substrate with a multilayer reflective film, reflective mask blank and reflective mask for EUV exposure according to the invention, Comparative Examples 1 and 2 for those Examples, and Example 4 including the embodiments of the mask blank substrate, transmissive mask blank and transmissive mask for ArF excimer laser exposure according to the invention, are described as follows.

Example 1

First, Example 1 for the mask blank substrate and the substrate with a multilayer reflective film for EUV exposure, the reflective mask blank and the reflective mask for EUV exposure according to the invention, is described.

<Fabrication of Mask Blank Substrate>

For a mask blank substrate 10, a $SiO_2$—$TiO_2$ glass substrate with a size of 152.4 mm×152.4 mm and a thickness of 6.35 mm was prepared, and the top and bottom sides of the glass substrate were polished step by step with cerium oxide abrasive particles or colloidal silica abrasive grains using a double-side polishing apparatus. Then, the glass substrate was subjected to a surface treatment with hydrosilicofluoric acid of a low concentration. The surface roughness of the surface of the glass substrate provided through the treatment was measured with an atomic force microscope, and the root mean square roughness (Rms) was 0.15 nm.

The surface shapes (surface state, flatness) of areas of 148 mm×148 mm at the top and bottom sides of the glass substrate and TTV (variation in thickness) were measured with a wavelength shift interferometer using a laser wavelength modulation. As a result, the flatnesses of the top and bottom sides of the glass substrate were 290 nm (convex shape). The results of measuring the surface shape (flatness) of the surfaces of the glass substrate was saved in a computer as height information with respect to a reference surface provided for each measuring point, and was compared with a reference value of 50 nm (convex shape) of the flatness of the top surface and the a reference value of 50 nm of the flatness of the bottom surface needed for the glass substrate, and a difference between the comparison results (required amount of removal) was computed by the computer.

Then, the processing conditions for the local surface processing according to the required amount of removal were set for each area with a processing spot shape in the surface of the glass substrate. A dummy substrate was spot-processed in advance in the same manner as in the actual processing without being moved for a given period of time, the shape of the dummy substrate was measured with the same measuring device as used to measure the shapes of the top and bottom surfaces, and the volume of spot processing per unit time was measured. Then, The scanning speed for raster scanning of the glass substrate was decided according to the required amount of removal obtained from the spot information and the information on the surface shape of the glass substrate.

The surface shape was adjusted by performing a local surface treatment by magneto rheological finishing (MRF) according to the processing conditions to be set, using a substrate finishing device with magnetic fluid, in such a way that the flatnesses of the top and bottom sides of the glass substrate would not become more than the reference value described above. It is noted that the magnetic viscoelastic fluid used for this treatment contained an iron component, and the polishing slurry was an aqueous alkali solution+ abrasives (about 2 wt %) with the abrasive being cerium oxide. Thereafter, the glass substrate was immersed in a cleaning bath (temperature of about 25° C.) containing aqueous hydrochloric acid with a concentration of about 10% for about 10 minutes, and then rinsed with pure water and dried by isopropyl alcohol.

The surface shape (surface state, flatness) of the obtained glass substrate surface was measured; the flatnesses of the top and bottom sides were about 40 to 50 nm. Further, the surface roughness of the surface of the glass substrate in an area of 1 µm×1 µm at an arbitrary location in the transfer-pattern forming area (132 mm×132 mm) was measured with an atomic force microscope, showing the root mean square roughness (Rms) of 0.37 nm, which rougher than the surface roughness before the local surface treatment with MRF.

Therefore, both sides were polished with a double-side polishing apparatus under the polishing conditions to keep or improve the surface shape of the surfaces of the glass substrate. This finish polishing was performed under the following polishing conditions:

working fluid: aqueous alkaline solution (NaOH)+abrasive (concentration: about 2 wt %)

abrasive: colloidal silica, average particle size: about 70 nm polishing plate rotational speed: about 1 to 50 rpm
processing pressure: about 0.1 to 10 kPa
polishing time: about 1 to 10 minutes Then, the glass substrate was rinsed with an aqueous alkaline solution (NaOH) to provide a mask blank substrate 10 of EUV exposure.

The flatnesses and surface roughnesses of the top and bottom sides of the provided mask blank substrate 10 were measured, and the flatnesses of the top and bottom sides were about 40 nm, which kept or improved the surface states before the double-side polishing and it is preferable. Further, an area of 1 μm×1 μm at an arbitrary location in the transfer-pattern forming area (132 mm×132 mm) in the provided mask blank substrate 10 was measured with an atomic force microscope, and the surface roughness was 0.13 nm in terms of the root mean square roughness (Rms), and the maximum height (Rmax) was 1.2 nm.

The local processing method for the mask blank substrate 10 according to the invention is not limited to the aforementioned magnetic viscoelastic fluid polishing method. The processing method may use gas cluster ion beams (GCIB) or local plasma.

Next, a TaBN film was deposited on the main surface of the aforementioned mask blank substrate 10 by DC magnetron sputtering. With a TaB target set to face the main surface of the mask blank substrate, reactive sputtering was performed under Ar+$N_2$ gas atmosphere. The elemental composition of the TaBN film was measured by Rutherford backscattering spectrometry, resulting in Ta: 80 atomic %, B: 10 atomic %, and N: 10 atomic %. The thickness of the TaBN film was 150 nm. Measurement of the crystal structure of the TaBN film showed that the crystal structure was an amorphous structure.

Then, the surface of the TaBN film was subjected to ultra-precision polishing using a single-side polishing apparatus. This ultra-precision polishing was performed under the following polishing conditions:

working fluid: aqueous alkaline solution (NaOH)+abrasive (average abrasive grain of 50 nm of colloidal silica, concentration: 5 wt %)
processing pressure: 50 g/cm$^2$
polishing time: about 1 to 10 minutes Next, the surface of the TaBN film was rinsed for 428 seconds with an aqueous solution of hydrofluoric acid (HF: concentration of 0.2 wt %), providing a mask blank substrate for EUV exposure.

An area of 1 μm×1 μm at an arbitrary location in the transfer-pattern forming area (132 mm×132 mm) on the surface of the TaBN film of the mask blank substrate 10 for EUV exposure provided as Example 1 was measured with an atomic force microscope; the surface roughness was 0.085 nm in terms of the root mean square roughness (Rms), and the maximum height (Rmax) was 1.1 nm. The results of the power spectrum analysis on the TaBN film surface of the provided mask blank substrate 10 for EUV exposure are shown by "+" in the graphs in FIGS. 7 and 8.

Figure 7:
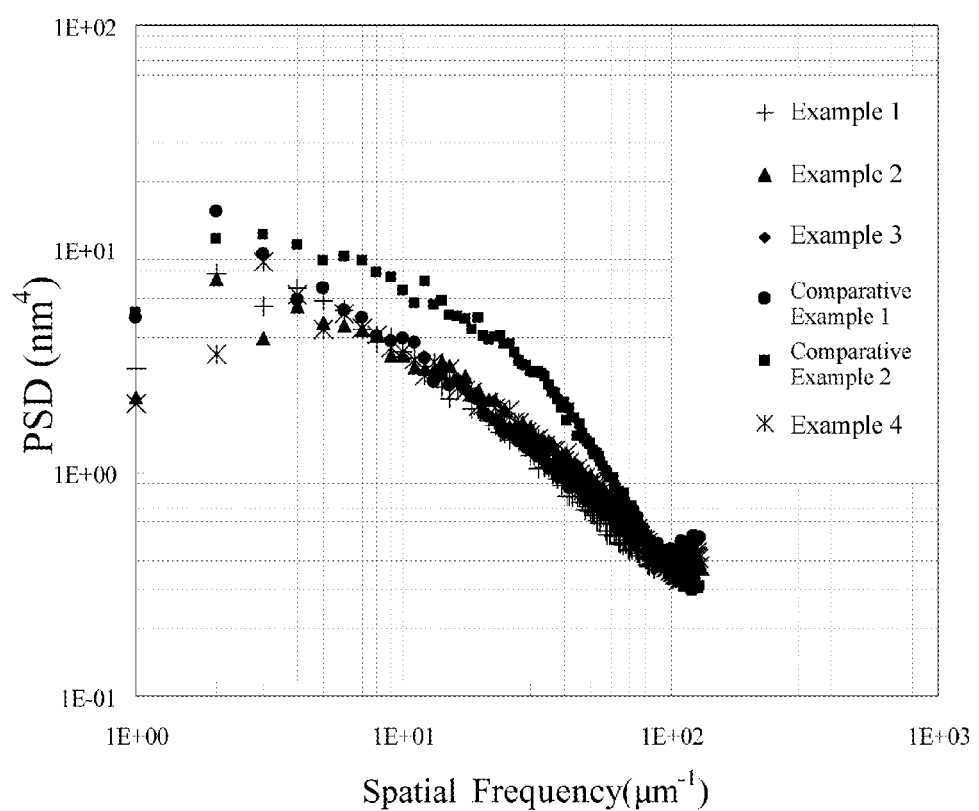
FIG. 7 is a graph illustrating the results of power spectral analysis of the main surfaces of the mask blank substrates according to Examples 1 to 4 of the present invention and Comparative Examples 1 and 2.
Figure 8:
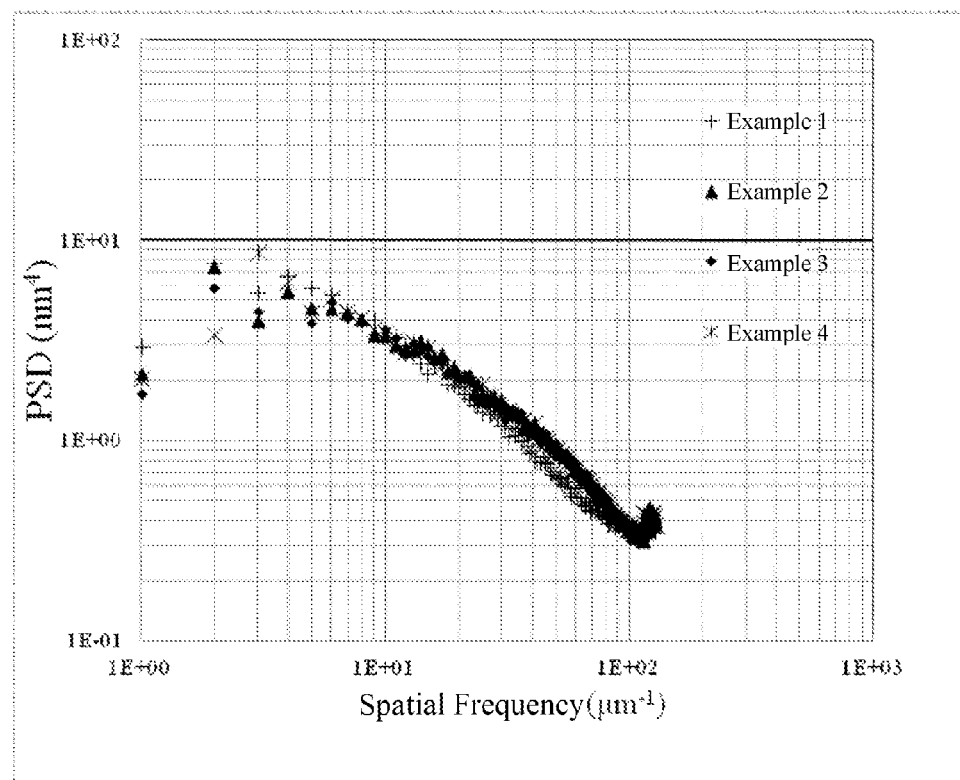
FIG. 8 is a graph obtained by extracting the results of the power spectral analysis of the main surfaces of the mask blank substrates of Examples 1 to 4 of the present invention in FIG. 7.

As shown in FIGS. 7 and 8, the power spectrum density, obtained by measuring an area of 1 μm×1 μm of the surface of the TaBN film of Example 1 with an atomic force microscope, at a spatial frequency of not less than 1 μm$^{-1}$ and not more than 10 μm$^{-1}$, had a maximum value of 7.73 nm$^4$ and a minimum value of 2.94 nm$^4$. In addition, the power spectrum density at a spatial frequency of not less than 10 μm$^{-1}$ and not more than 100 μm$^{-1}$ had a maximum value of 3.47 nm$^4$ and a minimum value of 1.86 nm$^4$. As illustrated in these figures, the power spectrum densities of the surface of the TaBN film of Example 1 at a spatial frequency of not less than 1 μm$^{-1}$ and at a spatial frequency of not less than 1 μm$^{-1}$ and not more than 10 μm$^{-1}$ were not more than 10 nm$^4$.

Defect inspection of an area of 132 mm×132 mm at the surface of the TaBN film of Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 18,789, showing that the false defects was significantly suppressed compared with the conventional number (more than 100,000) of detected defects. The total number of detected defects of about 18,789 can ensure that presence or absence of critical defects such as a foreign matter or scratches is easily inspected. The SEVD can be calculated from SEVD=$2(3S/4\pi h)^{1/3}$ where S represents the area of a defect and h represents the height of the defect. (The same is true of the following Examples and Comparative Examples.) The defect area S and the defect height h can be measured by an atomic force microscopy (AFM).

Further, defect inspection of an area of 132 mm×132 mm at the surface of the TaBN film of Example 1 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, which enables inspection of critical defects.

<Fabrication of Substrate with Multilayer Reflective Film>

The substrate with a multilayer reflective film 20 was fabricated by forming the multilayer reflective film 21 having alternate lamination of high refractive index layers and low refractive index layers, and the protective film 22 by ion beam sputtering, on the surface of the TaBN film of the above-described mask blank substrate 10 for EUV exposure.

For the multilayer reflective film 21, 40 pairs of Si and Mo films, each pair having a Si film with a thickness of 4.2 nm and a Mo film with a thickness of 2.8 nm (total film thickness of 280 nm), were deposited. Further, the protective film 22 of Ru with a thickness of 2.5 nm was deposited on the surface of the multilayer reflective film 21. It is noted that the multilayer reflective film 21 was deposited by ion beam sputtering in such a way that the incident angle of sputtered particles for the Si film to the normal line of the main surface of the substrate was 5 degrees, and the incident angle of sputtered particles for the Mo films thereto was 65 degrees.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.141 nm in terms of the root mean square roughness (Rms), and the maximum height (Rmax) was 1.49 nm. In addition, the power spectrum density at a spatial frequency of not less than 1 μm$^{-1}$ and not more than 10 μm$^{-1}$ was not more than 20 nm$^4$, and had a maximum value of 14.4 nm$^4$ and a minimum value of 0.13 nm$^4$. The power spectrum density at a spatial frequency of not less than 10 μm$^{-1}$ and not more than 100 μm$^{-1}$ was not more than 9 nm$^4$, and had a maximum value of 7.64 nm$^4$ and a minimum value of 0.09 nm$^4$.

Defect inspection of an area of 132 mm×132 mm at the surface of the protective film of the substrate with a multilayer reflective film 20 of Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 19,132, showing that the false defects was significantly suppressed compared with the conventional number (more than 100,000) of detected defects. In addition, the reflectance for EUV light was measured, resulting in good results of 65%.

Further, defect inspection of an area of 132 mm×132 mm at the surface of the multilayer reflective film of Example 1 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, which enables inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

Fiducial marks for managing coordinates were formed on the protective film 22 and the multilayer reflective film 21 of the substrate with a multilayer reflective film 20 of Example 1, at four locations outside the transfer-pattern forming area (132 mm×132 mm) by a focused ion beam.

<Fabrication of Reflective Mask Blank for EUV Exposure>

The back-side conductive film 23 was formed by DC magnetron sputtering, on the bottom side of the aforementioned substrate with a multilayer reflective film 20 where the multilayer reflective film 21 was not formed. For the back-side conductive film 23, reactive sputtering was performed on the back-side conductive film 23, with a Cr target set to face the bottom side of the substrate with a multilayer reflective film 20, under an Ar+$N_2$ (Ar:$N_2$=90%: 10%) gas atmosphere. The elemental composition of the back-side conductive film 23 was measured by Rutherford backscattering spectrometry. The results were Cr: 90 atomic % and N: 10 atomic %. The thickness of the back-side conductive film 23 was 20 nm.

Further, the absorber film 24 comprising a TaBN film was deposited by DC magnetron sputtering, on the surface of the protective film 22 of the aforementioned substrate with a multilayer reflective film 20, thereby fabricating the reflective mask blank 30. For the absorber film 24, reactive sputtering was performed on the absorber film 24 with a TaB target (Ta:B=80:20) set to face the absorber film 24 of the substrate with a multilayer reflective film 20, under Xe+$N_2$ gas (Xe:$N_2$=90%:10%) atmosphere. The elemental composition of the absorber film 24 was measured by Rutherford backscattering spectrometry. The results were Ta: 80 atomic %, B: 10 atomic %, and N: 10 atomic %. In addition, the thickness of the absorber film 24 was 65 nm. Measurement of the crystal structure of the absorber film 24 showed that the crystal structure was an amorphous structure.

<Fabrication of Reflective Mask>

A resist was coated on the surface of the aforementioned absorber film 24 by spin coating, followed by heating and cooling processes, for forming a resist film 25 with a thickness of 150 nm. Then, a resist pattern was formed through desired drawing and developing. With the resist pattern used as a mask, the TaBN film serving as the absorber film 24 was patterned by dry etching with $Cl_2$+He gas, forming the absorber pattern 27 on the protective film 22. Then, the resist film 25 was removed, and the resultant structure was chemically cleaned in the above-described manner to fabricate the reflective mask 40. In the drawing process, drawing data was corrected in such a way that the absorber pattern 27 was placed at a location where critical defects are present, based on defect data created based on the fiducial marks, and data on a pattern to be transferred (circuit pattern), thus fabricating the reflective mask 40. Defection inspection of the provided reflective mask 40 was performed using the high-sensitivity defect inspection apparatus ("Teron 600 series" of KLA-Tencor Corp.), but defects were not observed.

Example 2

<Fabrication of Mask Blank Substrate>

For a mask blank substrate 10, a $SiO_2$—$TiO_2$ glass substrate with a size of 152.4 mm×152.4 mm and a thickness of 6.35 mm was prepared as the mask blank substrate 10 for EUV exposure, and the top and bottom sides of the glass substrate were subjected to processes from polishing with the double-side polishing apparatus to the local surface treatment by magnetic viscoelastic fluid polishing, with the same manner as in Example 1.

Thereafter, noncontact polishing of the top and bottom sides of the glass substrate was performed as finish polishing in the local surface treatment. In Example 2, EEM (Elastic Emission Machining) was performed as the non-contact polishing. The EEM was performed under the following processing conditions.

working fluid (first stage): aqueous alkaline solution (NaOH)+fine powder particles (concentration: 5 wt %)

working fluid (second stage): pure water fine powder particles: colloidal silica, average particle size: about 100 nm rotational body: polyurethane roll rotational speed of the rotating body: 10 to 300 rpm rotational speed of the work holder: 10 to 100 rpm polishing time: 5 to 30 minutes An area of 1 μm×1 μm at an arbitrary location in the transfer-pattern forming area (132 mm×132 mm) on the main surface of the mask blank substrate 10 for EUV exposure provided by Example 2 was measured with an atomic force microscope; the root mean square roughness (Rms) was 0.10 nm, and the maximum height (Rmax) was 1.0 nm. The results of the power spectrum analysis on the main surface of the provided mask blank substrate 10 for EUV exposure are shown by "▲" in the graphs in FIGS. 7 and 8.

As shown in FIGS. 7 and 8, the power spectrum density, obtained by measuring an area of 1 μm×1 μm of the main surface of the mask blank substrate 10 for EUV exposure of Example 2 with an atomic force microscope, at a spatial frequency of not less than 1 $μm^{-1}$ and not more than 10 $μm^{-1}$, had a maximum value of 7.40 $nm^4$ and a minimum value of 2.16 $nm^4$. In addition, the power spectrum density at a spatial frequency of not less than 10 $μm^{-1}$ and not more than 100 $μm^{-1}$ had a maximum value of 3.32 $nm^4$ and a minimum value of 2.13 $nm^4$. As illustrated in these figures, the power spectrum densities of the surface of the main surface of the mask blank substrate of Example 2 at a spatial frequency of not less than 1 μm$^{-1}$ and at a spatial frequency of not less than 1 μm$^{-1}$ and not more than 10 μm$^{-1}$ were not more than 10 nm$^4$.

Defect inspection of an area of 132 mm×132 mm at the main surface of the mask blank substrate 10 for EUV exposure of Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 29,129, showing that the false defects was significantly suppressed compared with the conventional number (more than 100,000) of detected defects. The total number of detected defects of about 29,129 can ensure that presence or absence of critical defects such as a foreign matter or scratches is easily inspected.

Further, defect inspection of an area of 132 mm×132 mm at the mask blank substrate 10 for EUV exposure of Example 2 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, which enables inspection of critical defects.

The multilayer reflective film 21 with a thickness 280 nm having Si films and Mo films alternately laminated, which is the same as Example 1, was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.143 nm in terms of the root mean square roughness (Rms), and the maximum height (Rmax) was 1.50 nm. In addition, the power spectrum density at a spatial frequency of not less than 1 μm$^{-1}$ and not more than 10 μm$^{-1}$ was not more than 20 nm$^4$, and had a maximum value of 17.4 nm$^4$ and a minimum value of 0.14 nm$^4$. The power spectrum density at a spatial frequency of not less than 10 μm$^{-1}$ and not more than 100 μm$^{-1}$ was not more than 9 nm$^4$, and had a maximum value of 8.62 nm$^4$ and a minimum value of 0.11 nm$^4$.

Defect inspection of an area of 132 mm×132 mm at the surface of the protective film of the substrate with a multilayer reflective film 20 of Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 30,011, showing that the false defects was significantly suppressed compared with the conventional number (more than 100,000) of detected defects.

Further, defect inspection of an area of 132 mm×132 mm at the surface of the multilayer reflective film of Example 2 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, which enables inspection of critical defects.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

Example 3

<Fabrication of Mask Blank Substrate>

In this Example 3, a SiO$_2$—TiO$_2$ glass substrate with a size of 152.4 mm×152.4 mm and a thickness of 6.35 mm was prepared as the mask blank substrate 10 for EUV exposure, which is the same as Examples 1 and 2, and the mask blank substrate 10 for EUV exposure was fabricated through substantially the same processes as done in Example 2. It is noted that, in Example 3, EEM processing at the second stage using pure water as the working fluid was omitted in finish polishing in the local surface treatment in Example 2.

An area of 1 μm×1 μm at an arbitrary location in the transfer-pattern forming area (132 mm×132 mm) on the main surface of the mask blank substrate 10 for EUV exposure provided by Example 3 was measured with an atomic force microscope; the root mean square roughness (Rms) was 0.11 nm, and the maximum height (Rmax) was 1.2 nm. The results of the power spectrum analysis on the main surface of the provided mask blank substrate 10 for EUV exposure are shown by "♦" in the graphs in FIGS. 7 and 8.

As shown in FIGS. 7 and 8, the power spectrum density, obtained by measuring an area of 1 μm×1 μm of the main surface of the mask blank substrate 10 for EUV exposure of Example 3 with an atomic force microscope, at a spatial frequency of not less than 1 μm$^{-1}$ and not more than 10 μm$^{-1}$, had a maximum value of 10.00 nm$^4$ and a minimum value of 3.47 nm$^4$. In addition, the power spectrum density at a spatial frequency of not less than 10 μm$^{-1}$ and not more than 100 μm$^{-1}$ had a maximum value of 3.96 nm$^4$ and a minimum value of 2.56 nm$^4$. As illustrated in these figures, the power spectrum densities of the surface of the main surface of the mask blank substrate of Example 3 at a spatial frequency of not less than 1 μm$^{-1}$ and at a spatial frequency of not less than 1 μm$^{-1}$ and not more than 10 μm$^{-1}$ were not more than 10 nm$^4$.

Defect inspection of an area of 132 mm×132 mm at the main surface of the mask blank substrate 10 for EUV exposure of Example 3 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.)

with an inspection light source wavelength of 193 nm. As a result, the number of defects detected including false defects was a total of 36,469, showing that the false defects was significantly suppressed compared with the conventional number (more than 100,000) of detected defects. The total number of detected defects of about 36,469 can ensure that presence or absence of critical defects such as a foreign matter or scratches is easily inspected.

Further, defect inspection of an area of 132 mm×132 mm at the mask blank substrate 10 for EUV exposure of Example 3 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, which enables inspection of critical defects.

<Fabrication of Substrate with Multilayer Reflective Film>

The multilayer reflective film 21 with a thickness 280 nm having Si films and Mo films alternately laminated, which is the same as Example 1, was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.146 nm in terms of the root mean square roughness (Rms), and the maximum height (Rmax) was 1.50 nm. In addition, the power spectrum density at a spatial frequency of not less than 1 $\mu m^{-1}$ and not more than 10 $\mu m^{-1}$ was not more than 20 $nm^4$, and had a maximum value of 17.9 $nm^4$ and a minimum value of 0.16 $nm^4$. The power spectrum density at a spatial frequency of not less than 10 $\mu m^{-1}$ and not more than 100 $\mu m^{-1}$ was not more than 9 $nm^4$, and had a maximum value of 8.76 $nm^4$ and a minimum value of 0.11 $nm^4$.

Defect inspection of an area of 132 mm×132 mm at the surface of the protective film of the substrate with a multilayer reflective film 20 of Example 3 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 38,856, showing that the false defects was significantly suppressed compared with the conventional number (more than 100,000) of detected defects.

Further, defect inspection of an area of 132 mm×132 mm at the surface of the multilayer reflective film of Example 3 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, which enables inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

The non-contact polishing as finish polishing of the local surface treatment in Examples 2 and 3 are not limited to the above-described EEM. For example, it is possible to apply float polish or catalyst-referred etching. In any case, finish polishing of the main surface of the glass substrate is preferably non-contact polishing using water or pure water.

Comparative Example 1

<Fabrication of Mask Blank Substrate>

For Comparative Example 1, a $SiO_2$—$TiO_2$ glass substrate with a size of 152.4 mm×152.4 mm and a thickness of 6.35 mm was prepared as the mask blank substrate 10 for EUV exposure, which is the same as Example 2.

In Comparative Example 1, unlike in Example 2, as fine polishing in the local surface treatment, ultra-precision polishing was performed with single-side polishing apparatus using a polishing slurry comprising colloidal silica (average particle size of 50 nm, concentration of 5 wt %) adjusted to acidity with a pH of 0.5 to 4, and then rinsing with sodium hydroxide (NaOH) having a concentration of 0.1 wt % was performed for a rinsing time of 300 seconds.

An area of 1 μm×1 μm at an arbitrary location in the transfer-pattern forming area (132 mm×132 mm) on the main surface of the mask blank substrate 10 for EUV exposure provided by Comparative Example 1 was measured with an atomic force microscope; the root mean square roughness (Rms) was 0.11 nm, and the maximum height (Rmax) was 1.0 nm. The results of the power spectrum analysis on the main surface of the provided mask blank substrate 10 for EUV exposure are shown by "●" in the graphs in FIGS. 7 and 9.

Figure 9:
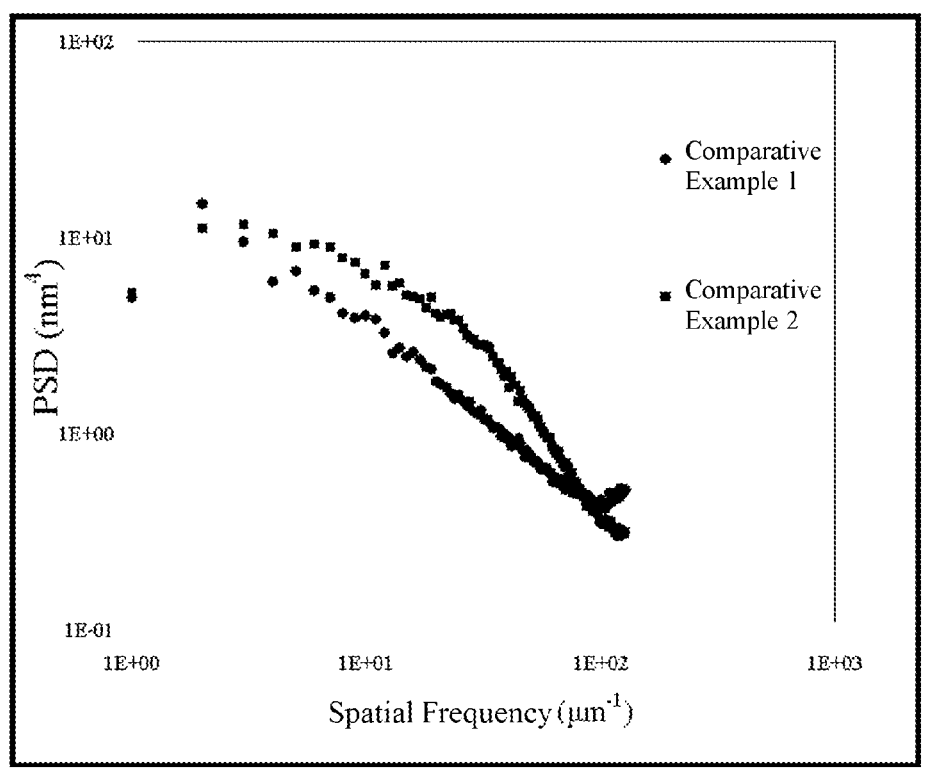
FIG. 9 is a graph obtained by extracting the results of the power spectral analysis of the main surfaces of the mask blank substrates of Comparative Examples 1 and 2 in FIG. 7.

As shown in FIGS. 7 and 9, the power spectrum density, obtained by measuring an area of 1 μm×1 μm of the main surface of the mask blank substrate 10 for EUV exposure of Comparative Example 1 with an atomic force microscope, at a spatial frequency of not less than 1 $\mu m^{-1}$ and not more than 10 $\mu m^{-1}$, had a maximum value of 14.81 $nm^4$ and a minimum value of 3.87 $nm^4$. As illustrated in these figures, the maximum values of the power spectrum densities of the surface of the main surface of the mask blank substrate of Comparative Example 1 at a spatial frequency of not less than 1 $\mu m^{-1}$ and at a spatial frequency of not less than 1 $\mu m^{-1}$ and not more than 10 $\mu m^{-1}$ exceeded 10 $nm^4$.

Defect inspection of an area of 132 mm×132 mm at the main surface of the mask blank substrate 10 for EUV exposure of Comparative Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, which disables inspection of the presence or absence of critical defects such as a foreign matter or scratches.

<Fabrication of Substrate with Multilayer Reflective Film>

The multilayer reflective film 21 with a thickness 280 nm having Si films and Mo films alternately laminated, which is the same as Example 1, was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.165 nm in terms of the root mean square roughness (Rms), and the maximum height (Rmax) was 1.61 nm. In addition, the power spectrum density at a spatial frequency of not less than 1 $μm^{-1}$ and not more than 10 $μm^{-1}$ exceeded 20 $nm^4$, and had a maximum value of 22.8 $nm^4$ and a minimum value of 0.19 $nm^4$. The power spectrum density at a spatial frequency of not less than 10 $μm^{-1}$ and not more than 100 $μm^{-1}$ exceeded 9 $nm^4$, and had a maximum value of 9.53 $nm^4$ and a minimum value of 0.12 $nm^4$.

Defect inspection of an area of 132 mm×132 mm at the surface of the protective film of the substrate with a multilayer reflective film 20 of Comparative Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, which disables inspection of the presence or absence of critical defects such as a foreign matter or scratches.

The same is true of the results of defect inspection of an area of 132 mm×132 mm at the surface of the protective film of the multilayer reflective film of Comparative Example 1 performed under the inspection sensitivity conditions that permit detection of defects of not more than 20 nm in terms of SEVD (Sphere Equivalent Volume Diameter) using the high-sensitivity defect inspection apparatus with an inspection light source wavelength of 13.5 nm. The results show that the total number of defects detected including false defects exceeded 100,000, which disables inspection of the presence or absence of critical defects. The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); although several tens of defects were observed, defect correction was performed with a defect correcting device to provide a reflective mask.

Comparative Example 2

In Comparative Example 2, a $SiO_2$—$TiO_2$ glass substrate with a size of 152.4 mm×152.4 mm and a thickness of 6.35 mm was prepared as the mask blank substrate 10 for EUV exposure, which is the same as Example 2.

In Comparative Example 2, unlike in Example 2, as fine polishing in the local surface treatment, ultra-precision polishing was performed with single-side polishing apparatus using a polishing slurry comprising colloidal silica (average particle size of 50 nm, concentration of 5 wt %) adjusted to alkalinity with a pH of 10, and then rinsing with hydrofluoric acid (HF) with a concentration of 0.2 wt % was performed for a rinsing time of 428 seconds.

An area of 1 μm×1 μm at an arbitrary location in the transfer-pattern forming area (132 mm×132 mm) on the main surface of the mask blank substrate 10 for EUV exposure provided by Comparative Example 2 was measured with an atomic force microscope; the root mean square roughness (Rms) was 0.15 nm, and the maximum height (Rmax) was 1.2 nm. The results of the power spectrum analysis on the main surface of the provided mask blank substrate 10 for EUV exposure are shown by "■" in the graphs in FIGS. 7 and 9.

As shown in FIGS. 7 and 9, the power spectrum density, obtained by measuring an area of 1 μm×1 μm of the main surface of the mask blank substrate 10 for EUV exposure of Comparative Example 2 with an atomic force microscope, at a spatial frequency of not less than 1 $μm^{-1}$ and not more than 10 $μm^{-1}$, had a maximum value of 11.65 $nm^4$ and a minimum value of 5.16 $nm^4$. In addition, the power spectrum density at a spatial frequency of not less than 10 $μm^{-1}$ and not more than 100 $μm^{-1}$ had a maximum value of 7.20 $nm^4$ and a minimum value of 4.08 $nm^4$. As illustrated in these figures, the maximum values of the power spectrum densities of the surface of the main surface of the mask blank substrate of Comparative Example 2 at a spatial frequency of not less than 1 $μm^{-1}$ and at a spatial frequency of not less than 1 $μm^{-1}$ and not more than 10 $μm^{-1}$ exceeded 10 $nm^4$.

Defect inspection of an area of 132 mm×132 mm at the main surface of the mask blank substrate 10 for EUV exposure of Comparative Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, which disables inspection of the presence or absence of critical defects such as a foreign matter or scratches.

<Fabrication of Substrate with Multilayer Reflective Film>

The multilayer reflective film 21 with a thickness 280 nm having Si films and Mo films alternately laminated, which is the same as Example 1, was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.173 nm in terms of the root mean square roughness (Rms), and the maximum height (Rmax) was 1.56 nm. In addition, the power spectrum density at a spatial frequency of not less than 1 $μm^{-1}$ and not more than 10 $μm^{-1}$ exceeded 20 $nm^4$, and had a maximum value of 25.2 $nm^4$ and a minimum value of 0.27 $nm^4$. The power spectrum density at a spatial frequency of not less than 10 $μm^{-1}$ and not more than 100 $μm^{-1}$ exceeded 9 $nm^4$, and had a maximum value of 9.60 $nm^4$ and a minimum value of 0.15 $nm^4$.

Defect inspection of an area of 132 mm×132 mm at the surface of the protective film of the substrate with a multilayer reflective film 20 of Comparative Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, which disables inspection of the presence or absence of critical defects such as a foreign matter or scratches.

The same is true of the results of defect inspection of an area of 132 mm×132 mm at the surface of the protective film of the multilayer reflective film of Comparative Example 2 using the high-sensitivity defect inspection apparatus with an inspection light source wavelength of 13.5 nm; the total number of defects detected including false defects in each detection exceeded 100,000, which disables inspection of the presence or absence of critical defects. For the high-sensitivity defect inspection apparatus with the inspection light source wavelength of 13.5 nm, defect inspection was performed under the inspection sensitivity conditions that would permit detection of defects with the SEVD of not more than 20 nm. The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); although several tens of defects were observed, defect correction was performed with a defect correcting device to provide a reflective mask.

Example 4

Next, Example 4 for the mask blank substrate, the transmissive mask blank, and the transmissive mask for ArF excimer laser exposure according to the invention is described.

<Fabrication of Mask Blank Substrate>

In Example 4, a synthetic quartz glass substrate of the same size as those in Examples 1 to 3 were used, except for which the mask blank substrate 10 for ArF excimer laser exposure was fabricated through processes similar to those in the above-described in <Fabrication of Mask Blank Substrate> of Example 2.

An area of 1 μm×1 μm at an arbitrary location in the transfer-pattern forming area (132 mm×132 mm) on the main surface of the mask blank substrate 10 for ArF excimer laser exposure provided by Example 4 was measured with an atomic force microscope; the root mean square roughness (Rms) was 0.11 nm, and the maximum height (Rmax) was 0.93 nm. The results of the power spectrum analysis on the main surface of the provided mask blank substrate 10 for ArF excimer laser exposure are shown by "*" in the graphs in FIGS. 7 and 8.

As shown in FIGS. 7 and 8, the power spectrum density, obtained by measuring an area of 1 μm×1 μm of the main surface of the mask blank substrate 10 for ArF excimer laser exposure of Example 4 with an atomic force microscope, at a spatial frequency of not less than 1 μm$^{-1}$ and not more than 10 μm$^{-1}$, had a maximum value of 8.72 nm$^4$ and a minimum value of 2.03 nm$^4$. As illustrated in these figures, the power spectrum densities of the surface of the main surface of the mask blank substrate of Example 4 at a spatial frequency of not less than 1 μm$^{-1}$ and at a spatial frequency of not less than 1 μm$^{-1}$ and not more than 10 μm$^{-1}$ were not more than 10 nm$^4$.

Defect inspection of an area of 132 mm×132 mm at the main surface of the mask blank substrate 10 for ArF excimer laser exposure of Example 4 was performed using the high-sensitivity defect inspection apparatus ("Teron 600 series" of KLA-Tencor Corp.) with an inspection light source wavelength of 193 nm. As a result, the number of defects detected including false defects was a total of 31,056, showing that the false defects was significantly suppressed compared with the conventional number (more than 100,000) of detected defects. The total number of detected defects of about 31,056 can ensure that presence or absence of critical defects such as a foreign matter or scratches is easily inspected.

<Fabrication of Transmissive Mask Blank>

The above-described mask blank substrate 10 for ArF excimer laser exposure was set into a DC magnetron sputtering apparatus, and a TaN layer was deposited on the main surface of the mask blank substrate 10. A gas mixture of Xe+N$_2$ was supplied into the DC magnetron sputtering apparatus to perform sputtering using a Ta target. As a result, a TaN layer with a thickness of 44.9 nm was deposited on the main surface of the mask blank substrate 10.

Then, the gas in the DC magnetron sputtering apparatus was replaced with a mixture gas of Ar+O$_2$ to perform sputtering using a Ta target again. As a result, a TaO layer with a thickness of 13 nm was deposited on the surface of the TaN layer, providing a transmissive mask blank (binary mask blank) with a 2-layered light shielding function film 51 formed on the mask blank substrate 10. The crystal structure of the light shielding function film 51 was measured by X-ray diffractometer (XRD), and it was an amorphous structure.

Defect inspection of an area of 132 mm×132 mm at the light shielding function film 51 on the mask blank substrate 10 of Example 4 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 33,121, showing that the false defects was significantly suppressed compared with the conventional number (more than 100,000) of detected defects. The total number of detected defects of about 33,121 can ensure that presence or absence of critical defects such as a foreign matter or scratches is easily inspected.

<Fabrication of Transmissive Mask>

A resist was coated on the surface of the aforementioned light shielding function film 51 by spin coating, followed by heating and cooling processes, for forming a resist film 25 with a thickness of 150 nm. Then, a resist pattern was formed through desired drawing and developing. With the resist pattern used as a mask, the TaO layer was patterned by dry etching with fluorinated (CHF$_3$) gas, then the TaN layer was patterned by dry etching with a chlorine (Cl$_2$) gas, forming the light-shielding-function film pattern 61 on the mask blank substrate 10. Thereafter, the resist film 25 was removed, and the resultant structure was chemically cleaned in the above-described manner to fabricate the transmissive mask 60. Defection inspection of the provided transmissive mask 60 was performed using the high-sensitivity defect inspection apparatus ("Teron 600 series" of KLA-Tencor Corp.), resulting in observation of no defects.

Example 5

A SiO$_2$—TiO$_2$ glass substrate with a size of 152.4 mm×152.4 mm and a thickness of 6.35 mm was prepared as the mask blank substrate 10 for EUV exposure, and the top and bottom sides of the glass substrate were subjected to processes from polishing with the double-side polishing apparatus to the local surface treatment by magnetic viscoelastic fluid polishing, with the same manner as in Example 1.

Thereafter, as final polishing of the local surface treatment, double-sided touch polishing using colloidal silica abrasive was carried out for the purpose of improving the surface roughness, and then a surface treatment by catalyst-referred etching (CARE) was carried out under the following processing conditions.

working fluid: pure water
catalyst: platinum
rotational speed of the substrate: 10.3 rotations/min
rotational speed of the catalyst: 10 rotations/min
processing time: 50 minutes
processing pressure: 250 hPa Then, after scrubbing the end faces of the glass substrate, the substrate was immersed in a cleaning tank containing aqua regia (temperature of about 65° C.) for about 10 minutes, after which the substrate was rinsed with pure water, followed by drying. It is noted that washing with aqua regia was performed multiple times until the top and bottom sides of the glass substrate were free of the residue of platinum serving as the catalyst.

An area of 1 μm×1 μm at an arbitrary location in the transfer-pattern forming area (132 mm×132 mm) on the main surface of the mask blank substrate 10 for EUV exposure provided by Example 5 was measured with an atomic force microscope; the root mean square roughness (Rms) was 0.040 nm, and the maximum height (Rmax) was 0.40 nm. The results of the power spectrum analysis on the main surface of the provided mask blank substrate 10 for EUV exposure are shown by "●" in the graphs in FIG. 10.

Figure 10:
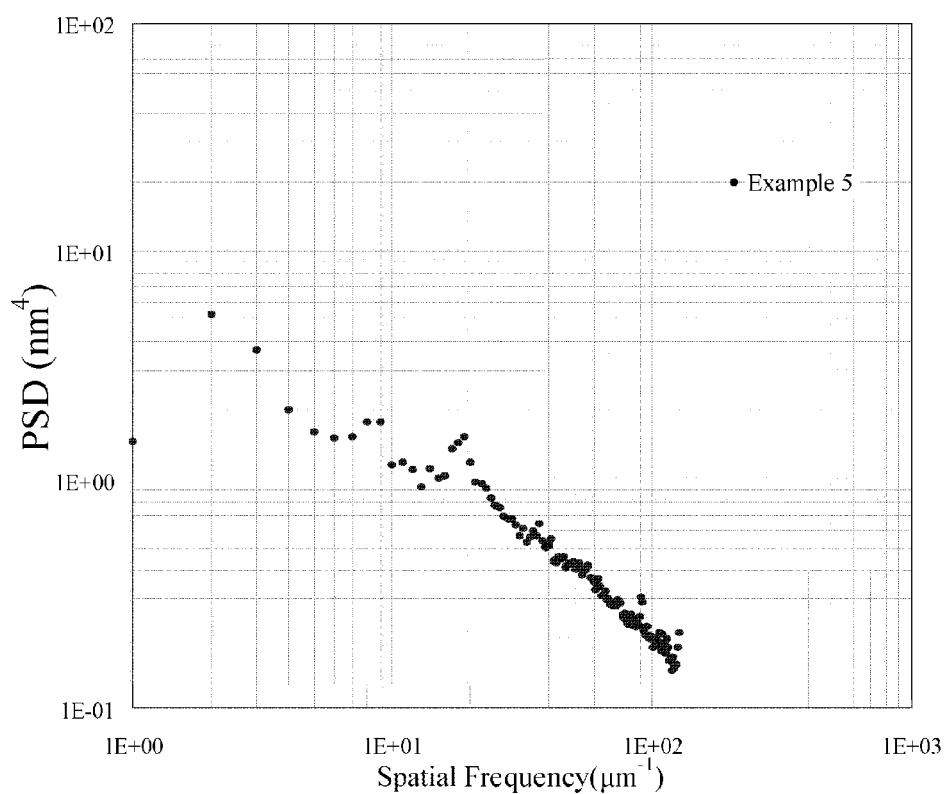
FIG. 10 is a graph illustrating the results of power spectral analysis of the main surface of the mask blank substrate of Example 5 of the present invention.

As shown in FIG. 10, the power spectrum density, obtained by measuring an area of 1 μm×1 μm of the main surface of the mask blank substrate 10 for EUV exposure of Example 5 with an atomic force microscope, at a spatial frequency of not less than 1 μm$^{-1}$ and not more than 10 μm$^{-1}$, had a maximum value of 5.29 nm$^4$ and a minimum value of 1.15 nm$^4$. In addition, the power spectrum density at a spatial frequency of not less than 10 μm$^{-1}$ and not more than 100 μm$^{-1}$ had a maximum value of 1.18 nm$^4$ and a minimum value of 0.20 nm$^4$. As illustrated in these figures, the power spectrum densities of the surface of the main surface of the mask blank substrate of Example 5 at a spatial frequency of not less than 1 μm$^{-1}$ and at a spatial frequency of not less than 1 μm$^{-1}$ and not more than 10 μm$^{-1}$ were not more than 10 nm$^4$.

Defect inspection of an area of 132 mm×132 mm at the main surface of the mask blank substrate 10 for EUV exposure of Example 5 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 370, showing that the false defects was significantly suppressed compared with the conventional number (more than 100,000) of detected defects. The total number of detected defects of about 370 can ensure that presence or absence of critical defects such as a foreign matter or scratches is easily inspected.

Further, defect inspection of an area of 132 mm×132 mm at the mask blank substrate 10 for EUV exposure of Example 5 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, which enables inspection of critical defects.

<Fabrication of Substrate with Multilayer Reflective Film>

The multilayer reflective film 21 with a thickness 280 nm having Si films and Mo films alternately laminated, which is the same as Example 1, was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.135 nm in terms of the root mean square roughness (Rms), and the maximum height (Rmax) was 1.27 nm. In addition, the power spectrum density at a spatial frequency of not less than 1 μm$^{-1}$ and not more than 10 μm$^{-1}$ was not more than 20 nm$^4$, and had a maximum value of 15.5 nm$^4$ and a minimum value of 0.09 nm$^4$. The power spectrum density at a spatial frequency of not less than 10 μm$^{-1}$ and not more than 100 μm$^{-1}$ was not more than 9 nm$^4$, and had a maximum value of 7.51 nm$^4$ and a minimum value of 0.10 nm$^4$.

Defect inspection of an area of 132 mm×132 mm at the surface of the protective film of the substrate with a multilayer reflective film 20 of Example 5 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 13,512, showing that the false defects was significantly suppressed compared with the conventional number (more than 100,000) of detected defects.

Further, defect inspection of an area of 132 mm×132 mm at the surface of the multilayer reflective film of Example 5 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, which enables inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

Example 6

A substrate with a multilayer reflective film was fabricated with the same manner as the above-described Example 5, except deposition was carried out by ion beam sputtering with the deposition conditions for the multilayer reflective film 21 such that the incident angle of sputtered particles for the Si film to the normal line of the main surface of the substrate was 30 degrees, and the incident angle of sputtered particles for the Mo films thereto was 30 degrees.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.116 nm in terms of the root mean square roughness (Rms), and the maximum height (Rmax) was 1.15 nm. In addition, the power spectrum density at a spatial frequency of not less than 1 μm$^{-1}$ and not more than 10 μm$^{-1}$ was not more than 20 nm$^4$, and had a maximum value of 9.98 nm$^4$ and a minimum value of 0.10 nm$^4$. The power spectrum density at a spatial frequency of not less than 10 μm$^{-1}$ and not more than 100 μm$^{-1}$ was not more than 9 nm$^4$, and had a maximum value of 4.81 nm$^4$ and a minimum value of 0.12 nm$^4$.

Defect inspection of an area of 132 mm×132 mm at the surface of the protective film of the substrate with a multilayer reflective film 20 of Example 6 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 4,758, showing that the false defects was significantly suppressed compared with the conventional number (more than 100,000) of detected defects.

Further, defect inspection of an area of 132 mm×132 mm at the surface of the multilayer reflective film of Example 6 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, which enables inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

Example 7

The multilayer reflective film 21 and the protective film 22 were formed on the mask blank substrate for EUV exposure according to Comparative Example 1 with the deposition conditions of the above-described Example 6, thereby fabricating a substrate with a multilayer reflective film.

With regard to the surface of the protective film 22 of the provided substrate with a multilayer reflective film 20, an area of 1 μm×1 μm at an arbitrary location in the transfer-pattern forming area (132 mm×132 mm) was measured with an atomic force microscope; the surface roughness was 0.122 nm in terms of the root mean square roughness (Rms), and the maximum height (Rmax) was 1.32 nm. In addition, the power spectrum density at a spatial frequency of not less than 1 μm$^{-1}$ and not more than 10 μm$^{-1}$ was not more than 20 nm$^4$, and had a maximum value of 13.3 nm$^4$ and a minimum value of 0.07 nm$^4$. The power spectrum density at a spatial frequency of not less than 10 μm$^{-1}$ and not more than 100 μm$^{-1}$ was not more than 9 nm$^4$, and had a maximum value of 6.74 nm$^4$ and a minimum value of 0.11 nm$^4$.

Defect inspection of an area of 132 mm×132 mm at the surface of the protective film of the substrate with a multilayer reflective film 20 of Example 7 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 10,218, showing that the false defects was significantly suppressed compared with the conventional number (more than 100,000) of detected defects. The reflectance to EUV light was measured, showing a good result of 65%.

Further, defect inspection of an area of 132 mm×132 mm at the surface of the protective film of the substrate with a multilayer reflective film 20 of Example 7 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, which enables inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

Further, the reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

<Method of Manufacturing Semiconductor Device>

Next, pattern transfer onto resist films on transferred substrates of semiconductor substrates with an exposure apparatus using the reflective masks and the transmissive masks according to the above-described Examples 1 to 7 and Comparative Examples 1 and 2 was performed. After that, an interconnection layer was patterned to fabricate semiconductor devices. As a result, when the reflective masks and the transmissive masks according to the above-described Examples 1 to 7 were used, the semiconductor devices could be fabricated without pattern defects, whereas when the reflective masks and the transmissive masks according to the above-described Comparative Examples 1 and 2 were used, pattern defects occurred, which resulted in defective semiconductor devices. This is because critical defects were buried in false defects and could not be detected in defect inspection on the mask blank substrate, the substrate with a multilayer reflective film, the reflective mask blank, and reflective mask, which resulted in improper drawing correction and improper mask correction, so that the reflective mask contained critical defects.

In the fabrication of the above-described substrate with a multilayer reflective film 20 and the reflective mask blank 30, the multilayer reflective film 21 and the protective film 22 were deposited on the main surface on that side of the mask blank substrate 10 where a transfer pattern is formed, followed by forming the back-side conductive film 23 on the bottom side opposite to that main surface, but which is not restrictive. The reflective mask blank 30 may be fabricated by forming the back-side conductive film 23 on the main surface of the mask blank substrate 10 opposite to the side where a transfer pattern is formed, and then depositing the multilayer reflective film 21 and further the protective film 22 on the main surface on the side where the transfer pattern is formed.

DESCRIPTION OF REFERENCE NUMERALS 10 a mask blank substrate
20 a substrate with a multilayer reflective film
21 a multilayer reflective film
22 a protective film
23 a back-side conductive film
24 an absorber film
27 an absorber pattern
30 a reflective mask blank
40 a reflective mask
50 a transmissive mask blank
51 a light shielding function film
60 a transmissive mask

The invention claimed is:

1. A transmissive mask blank comprising a light shielding function film to be a transfer pattern on the main surface of a mask blank substrate, wherein the surface of the light shielding function film has a power spectrum density of not more than 10 nm$^4$, obtained by measuring an area of 1 μm×1 μm with an atomic force microscope, at a spatial frequency of not less than 1 μm$^{-1}$ and not more than 10 μm$^{-1}$.

2. The transmissive mask blank according to claim 1, wherein the power spectrum density is not less than 1 nm$^4$ and not more than 10 nm$^4$.

3. The transmissive mask blank according to claim 1, wherein the transmissive mask blank is a binary mask blank with a light shielding film for shielding exposure light formed on the mask blank substrate.

4. The transmissive mask blank according to claim 1, wherein the transmissive mask blank is a phase-shift mask blank with a phase shift film for changing the phase difference of exposure light formed on the mask blank substrate.

5. The transmissive mask blank according to claim 4, wherein the phase-shift mask blank has a structure with a light shielding film for shielding the exposure light formed on the phase shift film.

6. The transmissive mask blank according to claim 1, wherein the transmissive mask blank is a transmissive mask blank with a resist film, the resist film to be a mask for patterning the light shielding function film, and formed on the light shielding function film.

7. A transmissive mask comprising a light shielding function film pattern provided on the main surface by patterning the light shielding function film of the transmissive mask blank according to claim 1.

8. A method of manufacturing a semiconductor device, comprising a step of forming a transfer pattern on a transferred substrate by performing a lithography process using an exposure device with the transmissive mask according to claim 7.

9. A substrate with a multilayer reflective film for use in lithography, comprising:
  a multilayer reflective film having a high refractive index layer and a low refractive index layer alternately laminated on a main surface of a mask blank substrate; and,
  a protective film on the multilayer reflective film,
  wherein a surface of the protective film has a root mean square roughness (Rms) of not more than 0.15 nm, obtained by measuring an area of 1 μm ×1 μm with an atomic force microscope, and has a power spectrum density of not more than 20 nm$^4$ at a spatial frequency of not less than 1 μm$^{-1}$.

10. The substrate with a multilayer reflective film according to claim 9, wherein the surface of the protective film of the substrate with a multilayer reflective film has a power spectrum density of not more than 20 nm$^4$, obtained by measuring an area of 1 μm×1 μm with an atomic force microscope, at a spatial frequency of not less than 1 μm$^{-1}$ and not more than 10 μm$^{-1}$.

11. The substrate with a multilayer reflective film according to claim 9, wherein the surface of the protective film of the substrate with a multilayer reflective film has a power spectrum density of not more than 9 nm$^4$, obtained by measuring an area of 1 μm ×1 μm with an atomic force microscope, at a spatial frequency of not less than 10 μm$^{-1}$ and not more than 100 μm$^{-1}$.

12. A reflective mask blank comprising an absorber film to be a transfer pattern on the protective film of the substrate with a multilayer reflective film according to claim 9.

13. A reflective mask comprising an absorber pattern provided on the protective film by patterning the absorber film of the reflective mask blank according to claim 12.

14. A method of manufacturing a semiconductor device, comprising forming a transfer pattern on a transferred substrate by performing a lithography process using an exposure device with the reflective mask according to claim 13.

* * * * *